United States Patent [19]
Ladha et al.

[11] Patent Number: 5,410,570
[45] Date of Patent: Apr. 25, 1995

[54] SELF SYNCHRONIZING AUTOMATIC CORRELATOR

[76] Inventors: Nizar Ladha, 192 Harrison Way, Newmarket, Ontario, Canada, L3Y 4B6; Nazir Dosani, 8 Harris Way, Thornhill, Ontario, Canada, L3T 5A7

[21] Appl. No.: 870,502

[22] Filed: Apr. 17, 1992

[30] Foreign Application Priority Data

Apr. 17, 1991 [GB] United Kingdom ............... 9108243

[51] Int. Cl.⁶ .................................................. H04L 7/00
[52] U.S. Cl. ..................................... 375/367; 375/343; 370/107
[58] Field of Search .................. 375/96, 115, 110, 119, 375/120, 1; 370/107

[56] References Cited

U.S. PATENT DOCUMENTS

| | | | |
|---|---|---|---|
| 4,817,148 | 3/1989 | Lafferty et al. | 375/115 |
| 5,128,998 | 7/1992 | Kurihara | 375/1 |

FOREIGN PATENT DOCUMENTS

1307451 2/1973 United Kingdom ............... 375/115

*Primary Examiner*—Stephen Chin
*Assistant Examiner*—T. Ghebretinsae
*Attorney, Agent, or Firm*—Knobbe, Martens, Olson & Bear

[57] ABSTRACT

A self synchronizing automatic correlator, comprising apparatus for receiving an input data signal; apparatus for receiving a free running clock signal; a clock recovery circuit for comparing the input data signal and the free running clock signal and generating a phase error signal responsive thereto, and for frequency adjusting the clock signal by an amount equal to the phase error signal and in response generating a recovered clock signal synchronized to the input data signal; a shift register for receiving and storing the input data signal under control of the recovered clock signal; apparatus for storing a user data signal; and apparatus connected to the shift register and the apparatus for storing for comparing the input data signal and the user data signal and in the event of a match therebetween generating an output signal for indicating valid detection of the input data signal.

14 Claims, 31 Drawing Sheets

| FIG. 2A | FIG. 2B | FIG. 2C | FIG. 2D | FIG. 2E |
|---------|---------|---------|---------|---------|
| FIG. 2F | FIG. 2G | FIG. 2H | FIG. 2I | FIG. 2J |
| FIG. 2K | FIG. 2L | FIG. 2M | FIG. 2N | FIG. 2O |

| FIG.3A | FIG.3B | FIG.3C | FIG.3D | FIG.3E |
|---|---|---|---|---|
| FIG.3F | FIG.3G | FIG.3H | FIG.3I | FIG.3J |

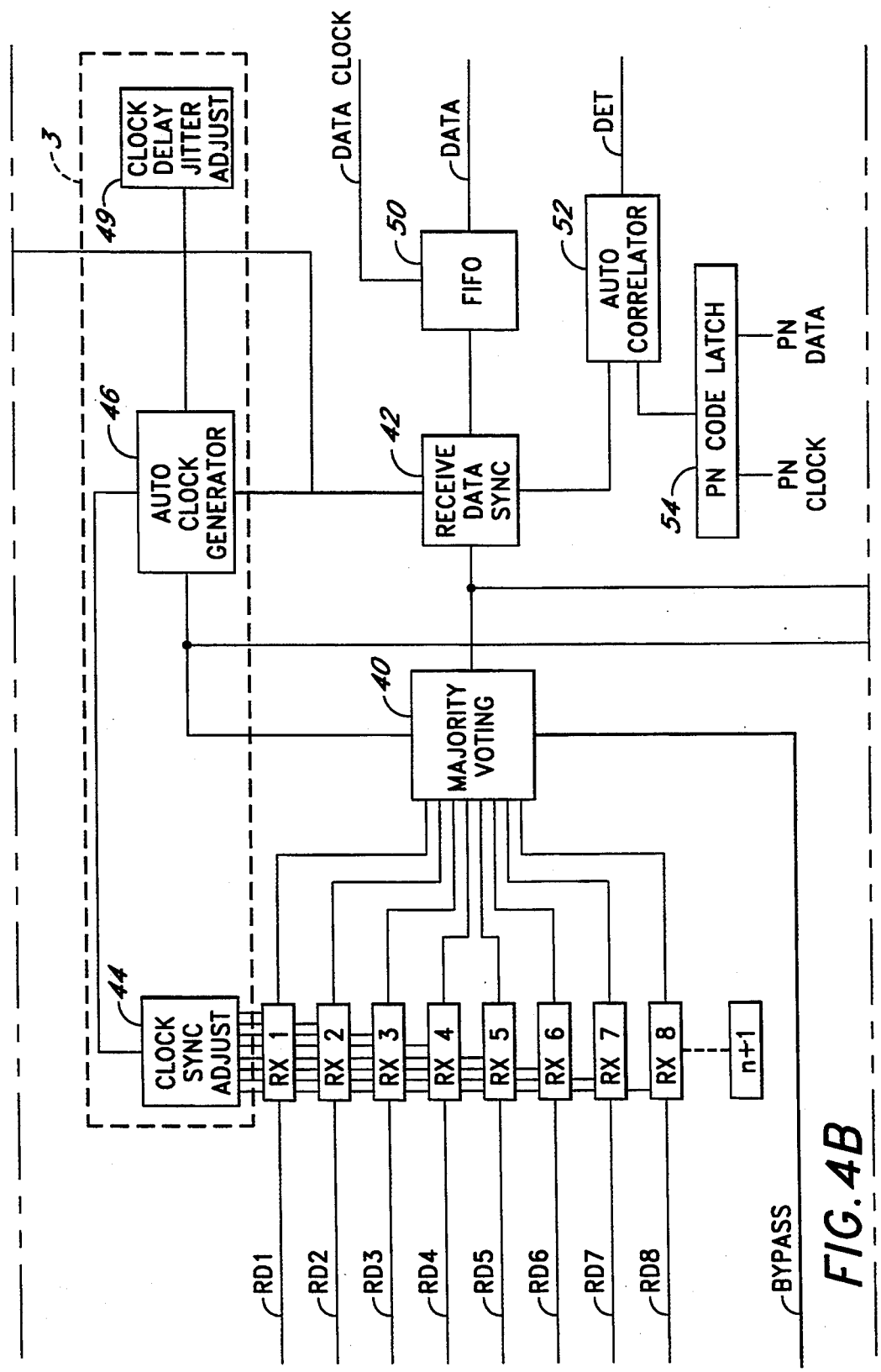

SELF SYNCHRONIZING AUTOMATIC CORRELATOR

FIELD OF THE INVENTION

This invention relates in general to bit and byte synchronization and correlation systems, and more particularly to a self synchronizing and automatic correlator for synchronization and automatic correlation of incoming modulated data signals.

BACKGROUND OF THE INVENTION

According to prior art systems, data synchronization is accomplished by first recovering a clock signal from a received data stream, and then comparing the clock signal with the incoming data. The difference in phase and frequency between the recovered clock signal and incoming data is used to correct the clock signal and thereby synchronize the data signal. In the prior art methodology, several clock cycles must elapse before a phase error of zero degrees is achieved. Thus, synchronization of data is never achieved on the first bit since by definition at least one bit must be compared to the recovered clock signal before synchronization may occur. Hence, prior art systems require the use of numerous bits as a preamble to achieve synchronization. In some instances, the preamble may be as high as 101 bits.

In the prior art systems, a sliding correlator is used for correlation of data, while for spread spectrum data, high speed microprocessors are used to achieve high chip rates.

SUMMARY OF THE INVENTION

According to the present invention, a system is provided for minimizing the preamble bits by accomplishing synchronization on the first chip, bit or byte of the input data.

More particularly, the present invention provides a self-synchronizing automatic correlator in which the received data signal adjusts the phase of a free running clock to provide a recovered clock signal which is then used to synchronize the data for achieving synchronization immediately upon receipt of the data signal, with no preamble bit delays, etc.

BRIEF DESCRIPTION OF THE DRAWINGS

A preferred embodiment of the invention will be discussed in greater detail below with reference to the following drawings, in which:

FIGS. 2A, 2B, 2C, 2D, 2E, 2F, 2G, 2H, 2I, 2J, 2K, 2L, 2M, 2N and 2O when combined as shown in FIG. 2, form a detailed schematic diagram of a receiver section of a self-synchronizing automatic correlator in accordance with the preferred embodiment;

FIGS. 3A, 3B, 3C, 3D, 3E, 3F, 3G, 3H, 3I and 3J when combined as shown in FIG. 3 form a detailed schematic diagram of a transmitter section of a self-synchronizing automatic correlator according to the preferred embodiment; and FIGS. 4A, 4B and 4C when combined as shown in FIG. 4, form is a block schematic diagram of an alternative embodiment of the invention.

DETAILED DESCRIPTION OF THE PREFERRED EMBODIMENT

Figure 1:
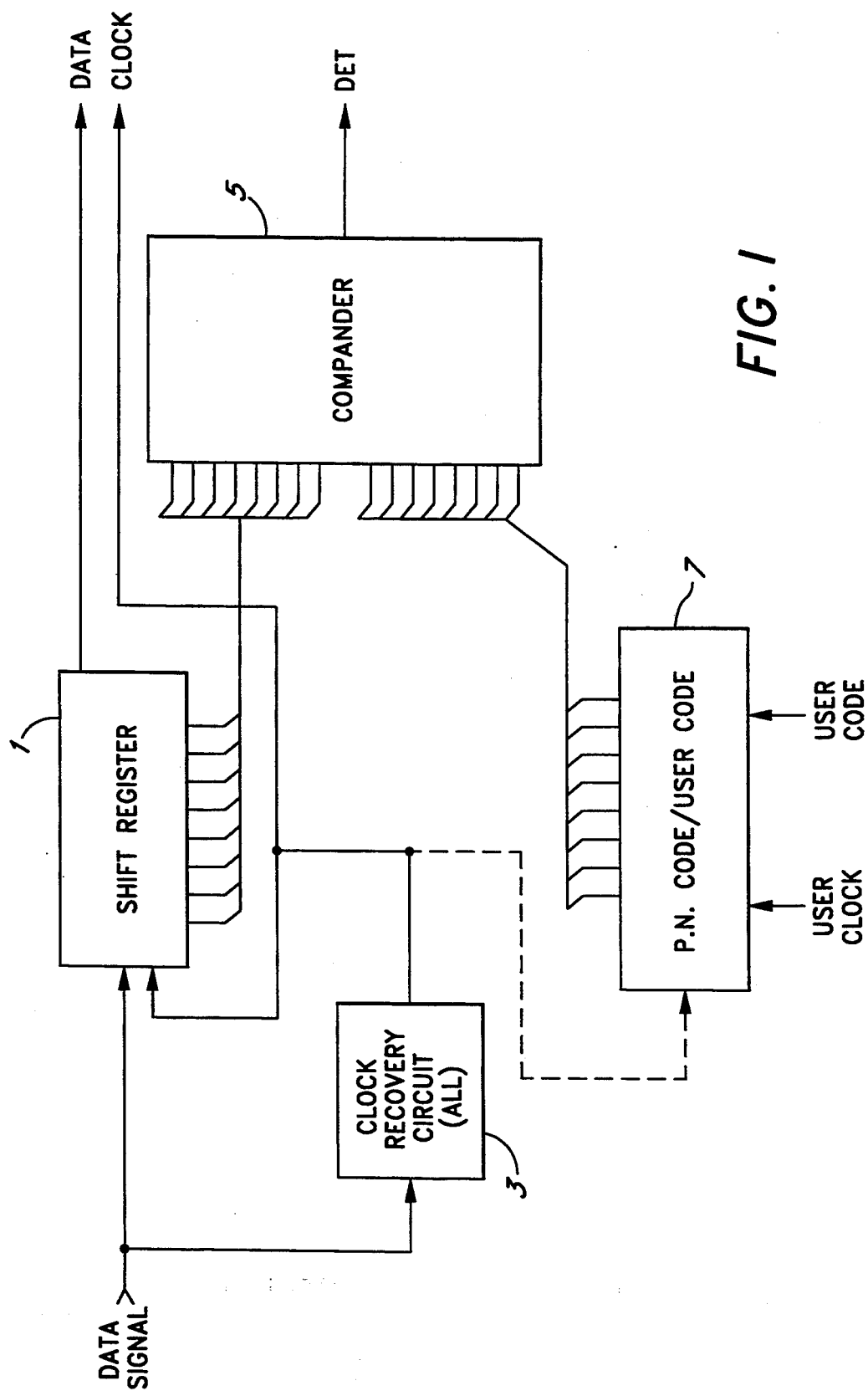
FIG. 1 is a block diagram of a self-synchronizing automatic correlator according to a broad aspect of the present invention.

Turning to FIG. 1, the system of the present invention is shown in two parts; data synchronization, and data de-spreader/comparator.

In operation, an incoming data signal is received simultaneously by shift register 1 and clock recovery circuit 3 which, according to the present invention incorporates a free running clock. The received data signal adjusts the frequency of the clock and the recovered clock signal output from circuit 3 is then used to synchronize the data being clocked into shift register 1. More particularly, the input data is compared to the free running clock which produces a phase error signal. The phase error signal is used to adjust the phase of the free running clock, which further reduces the phase error, in the manner of a phase locked loop. Therefore, synchronization is achieved immediately upon receipt of the data signal, with no preamble bit delays, etc.

In fact, according to the present invention, synchronization may be achieved upon receipt of the first data bit or even the first chip. In spread spectrum and other modulated data communication schemes, bits may be broken down into constituent elements referred to as "chips", each chip typically corresponding to a different modulation frequency, amplitude, etc.

The synchronized data stored in shift register 1 is then output to a first input port of compander 5. The second input port of compander 5 receives predetermined user code data from a user code latch 7. The code data latched into compander 5 from circuit 7 may be permanently applied to the input of compander 5, or clocked using the recovered clock signal from circuit 3 (as shown in dashed lines). Latch 7 is loaded with the user code via the user clock.

Within compander 5, the synchronized data from shift register 1 is compared with the user code data from latch 7 and in the event of a match, correlation is deemed to have occurred and compander 5 generates a detect signal DET. Alternatively, the user code may be used to de-spread the data such that true data appears on the DET line.

Although the system as depicted in FIG. 1 relates to synchronization of incoming digital data, the system is equally applicable to analogue data in which case shift register 1 is replaced by an analogue variable delay line.

If the incoming signal is analogue, the data is shifted out of circuit 1 in synchronization with the derived clock signal when the error produced by the free running clock is zero. In the event that the signal is digital, the data is shifted out in synchronization with the clock signal when the clock signal is in phase with the first bit of received data.

The correlation detect signal DET is provided along with the synchronized data signal output from shift register 1 and the recovered clock signal output from clock recovery circuit 3 to the host system independently of the host system clock.

The system of the present invention may be implemented in hardware and/or software. Furthermore, the system may be utilized with all forms of data transmission media (e.g. wire, wireless, fibre optics, etc.).

Figure 2A:
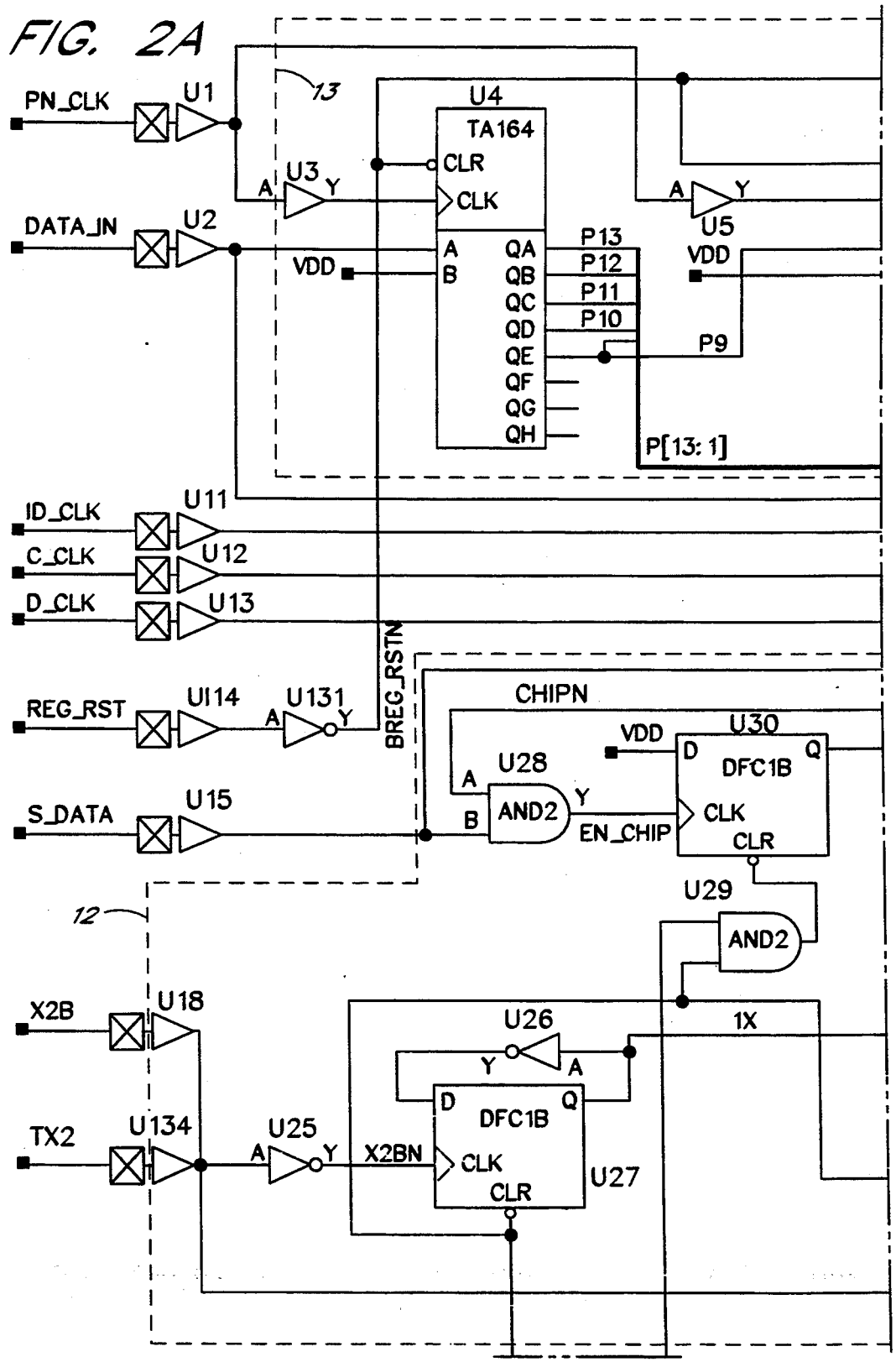
Figure 2B:
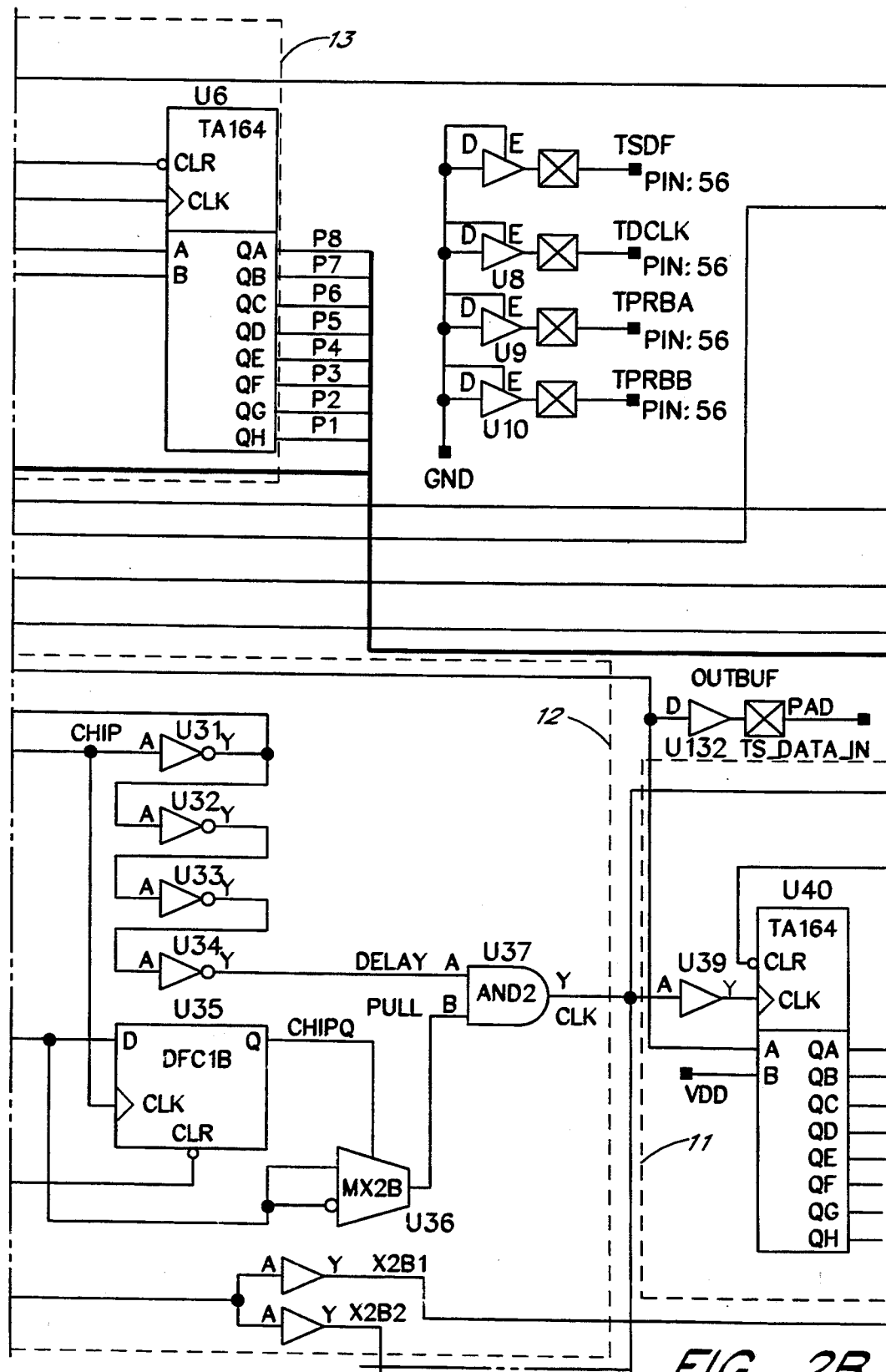
Figure 2C:
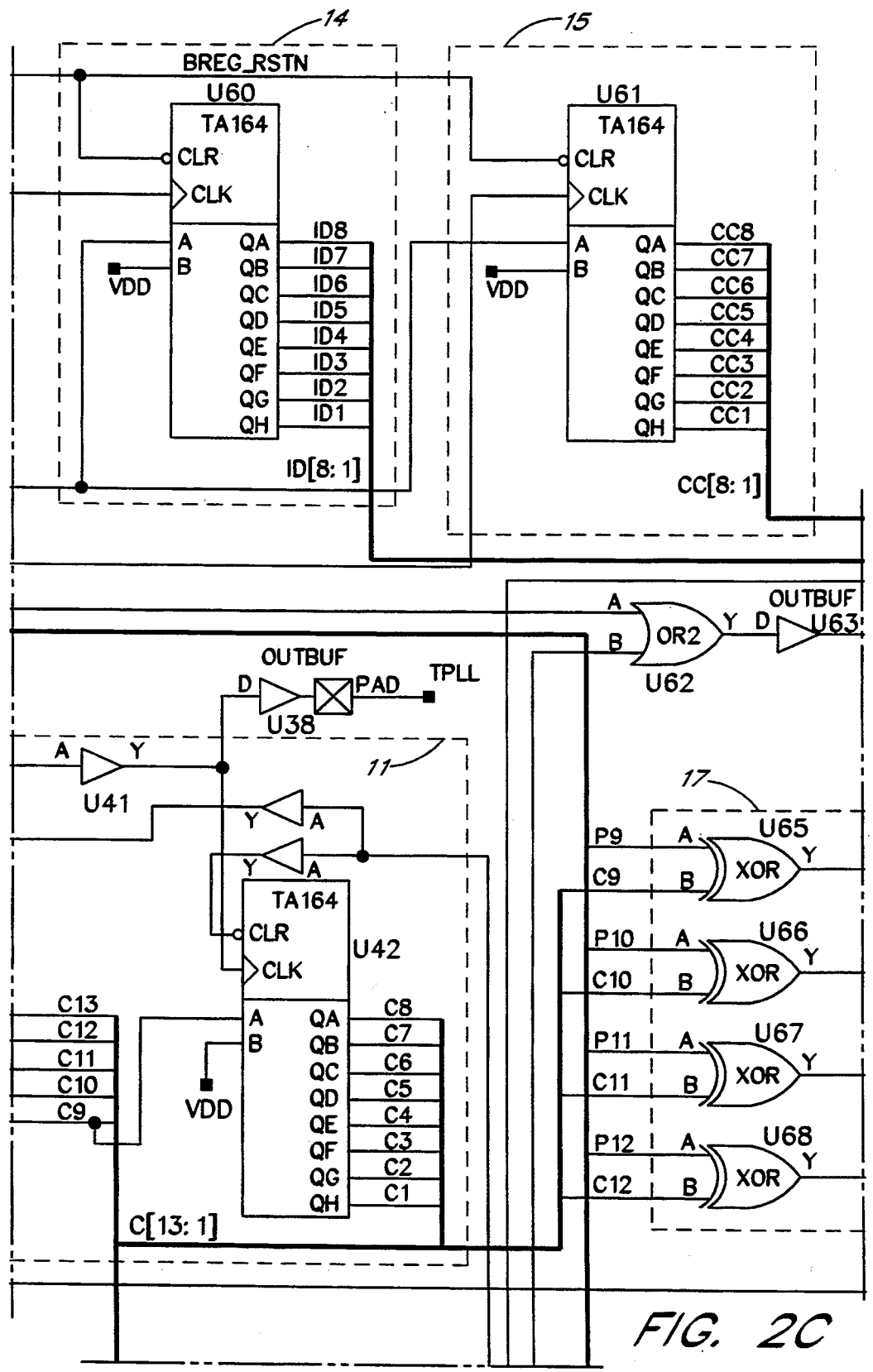
Figure 2D:
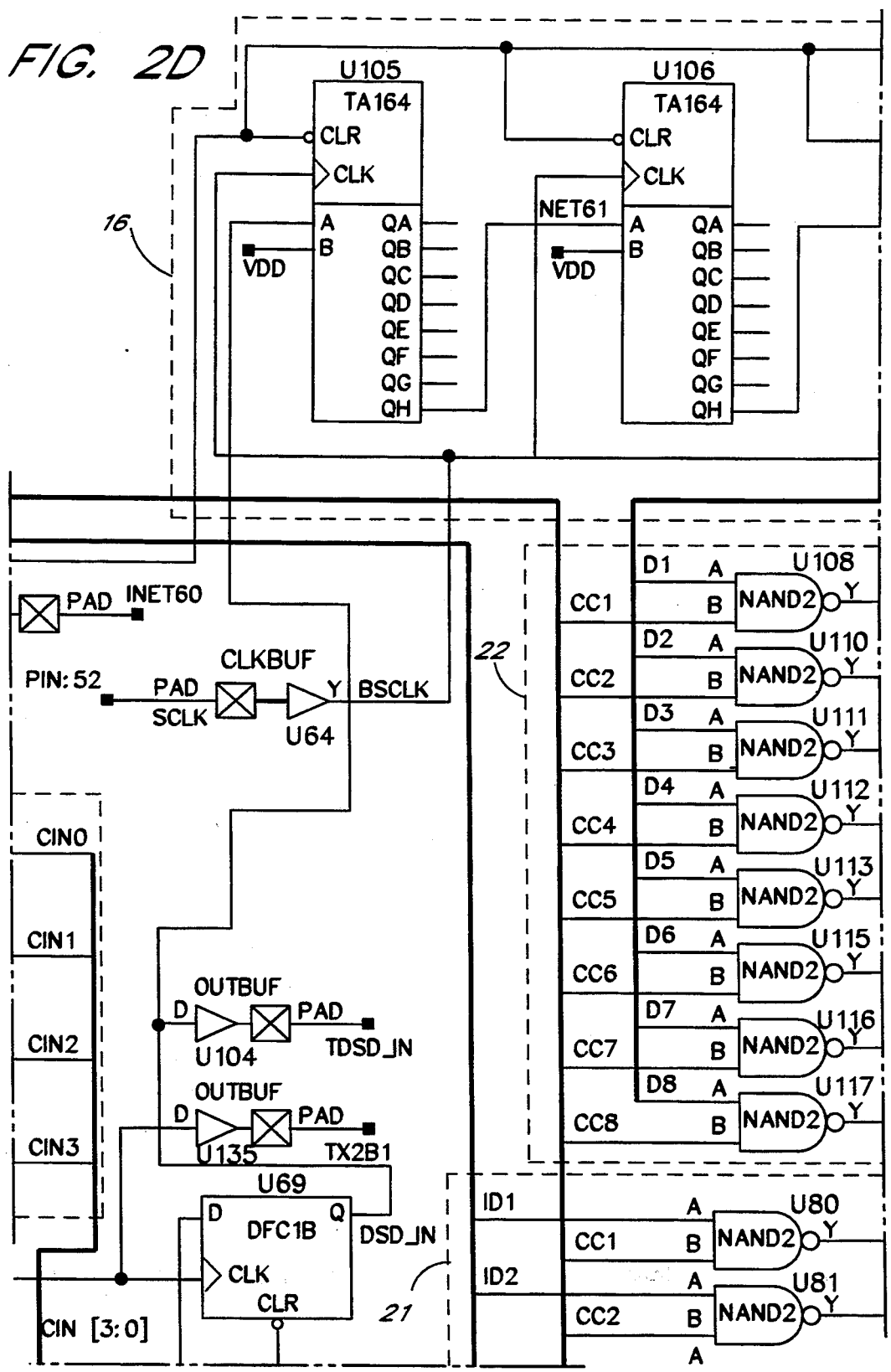
Figure 2E:
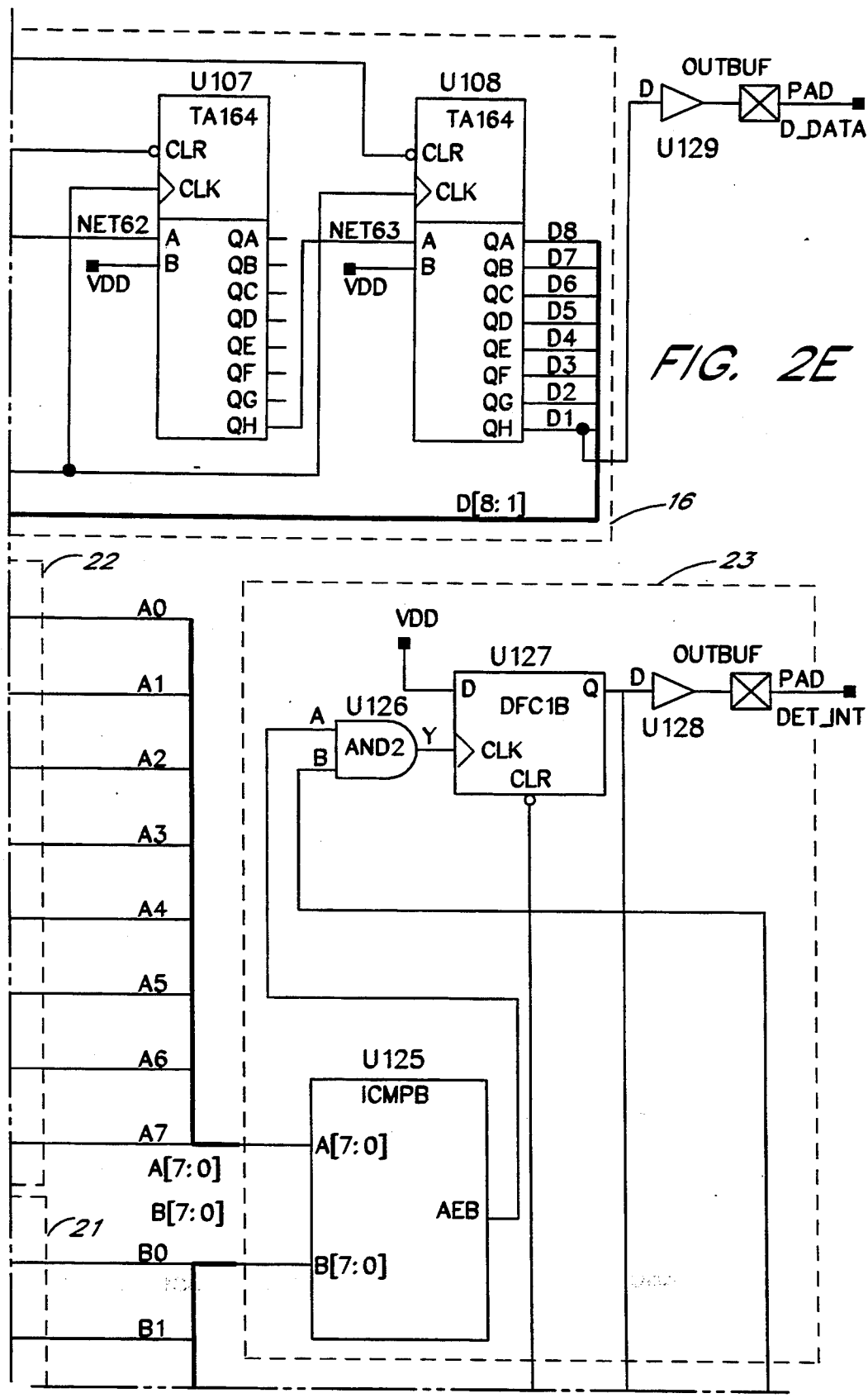
Figure 2F:
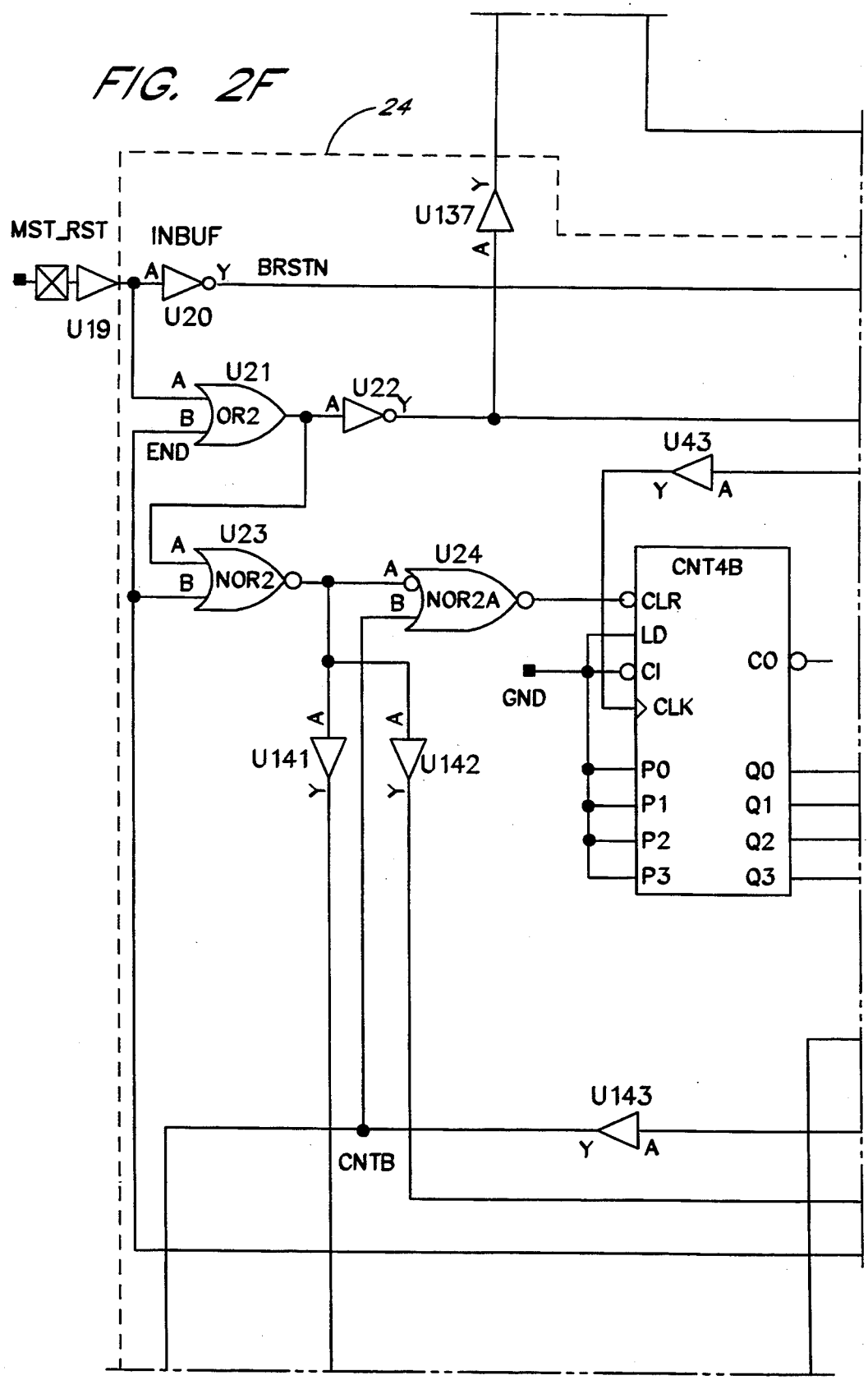
Figure 2G:
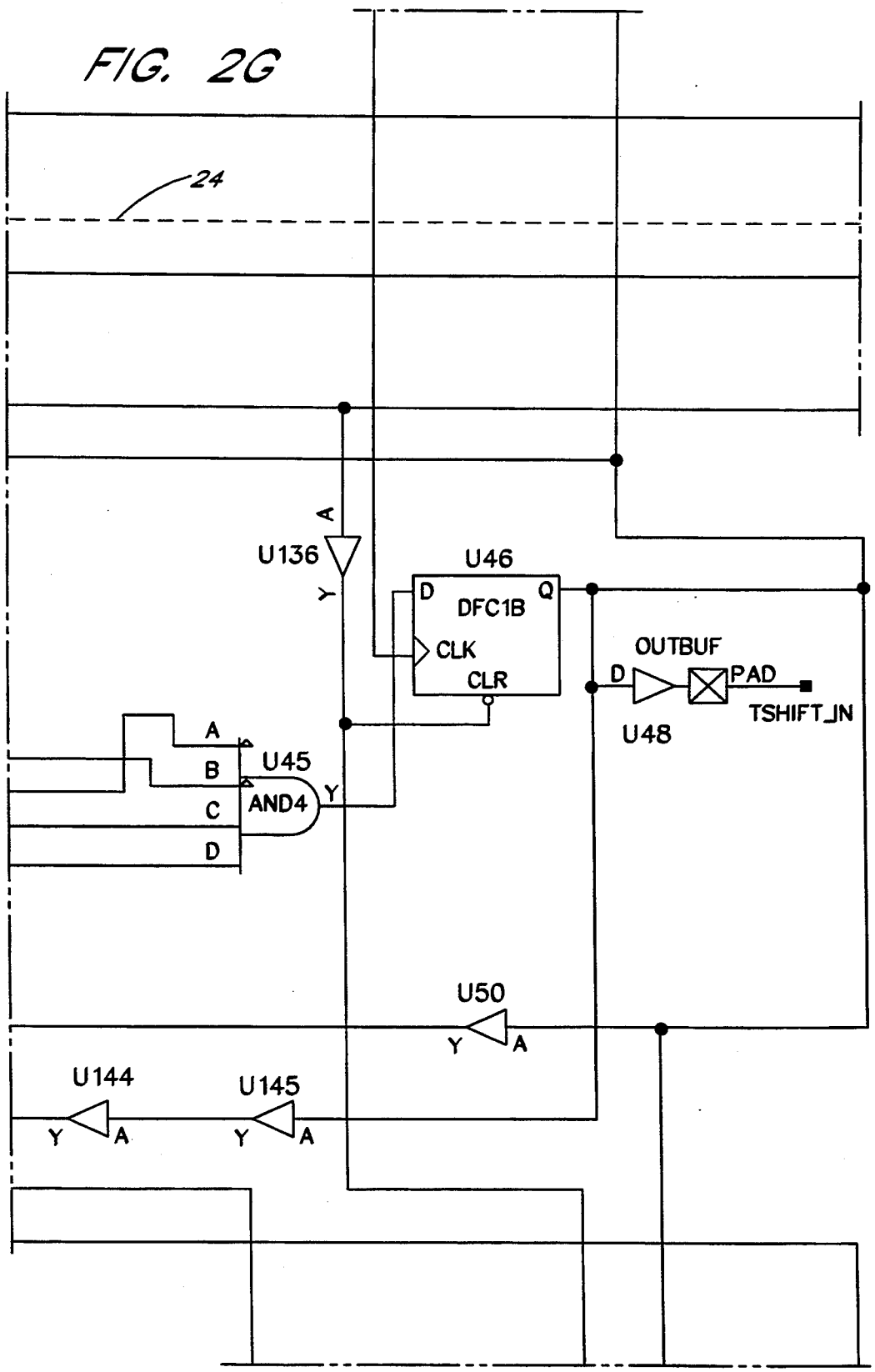
Figure 2H:
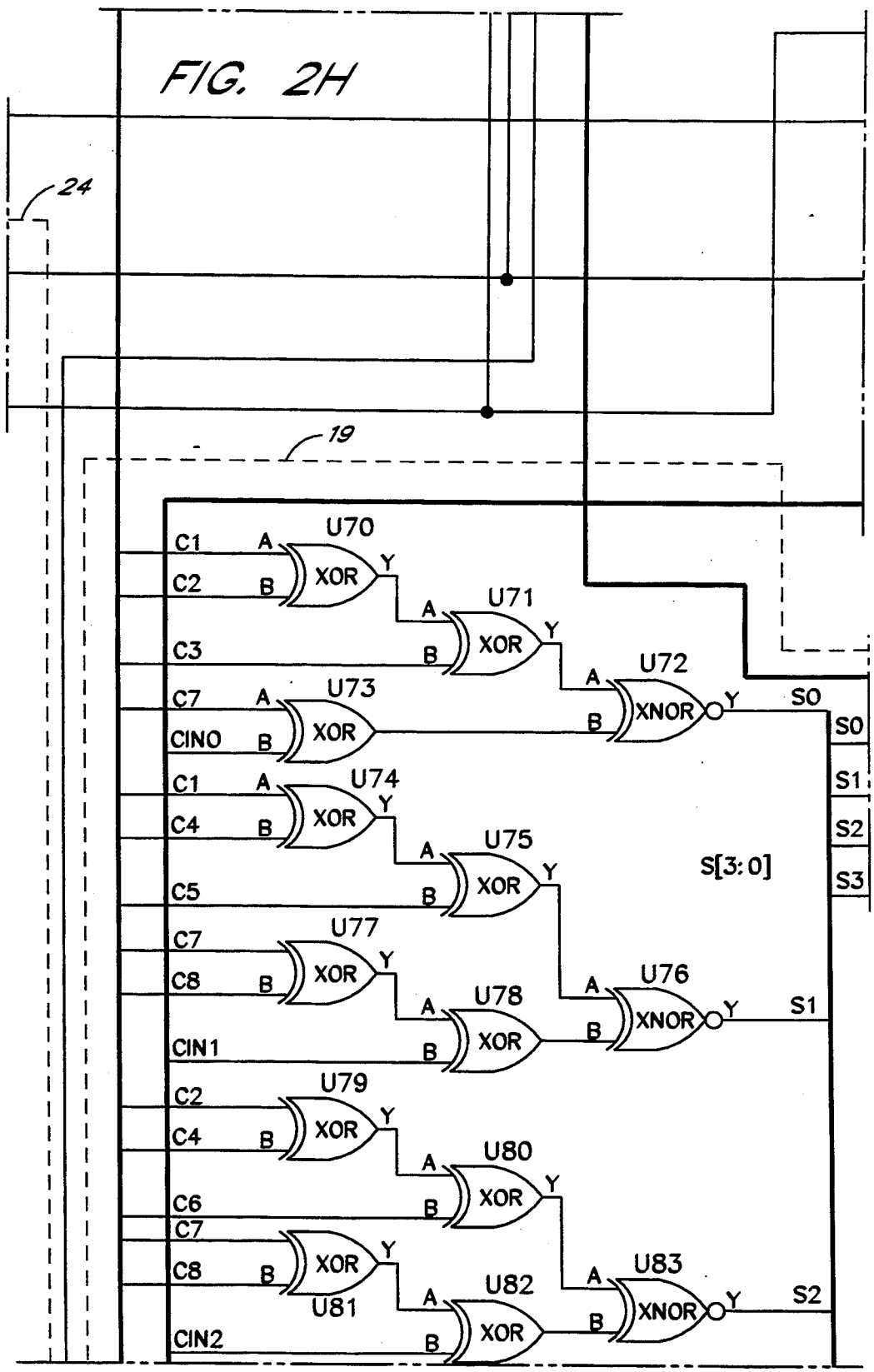
Figure 21:
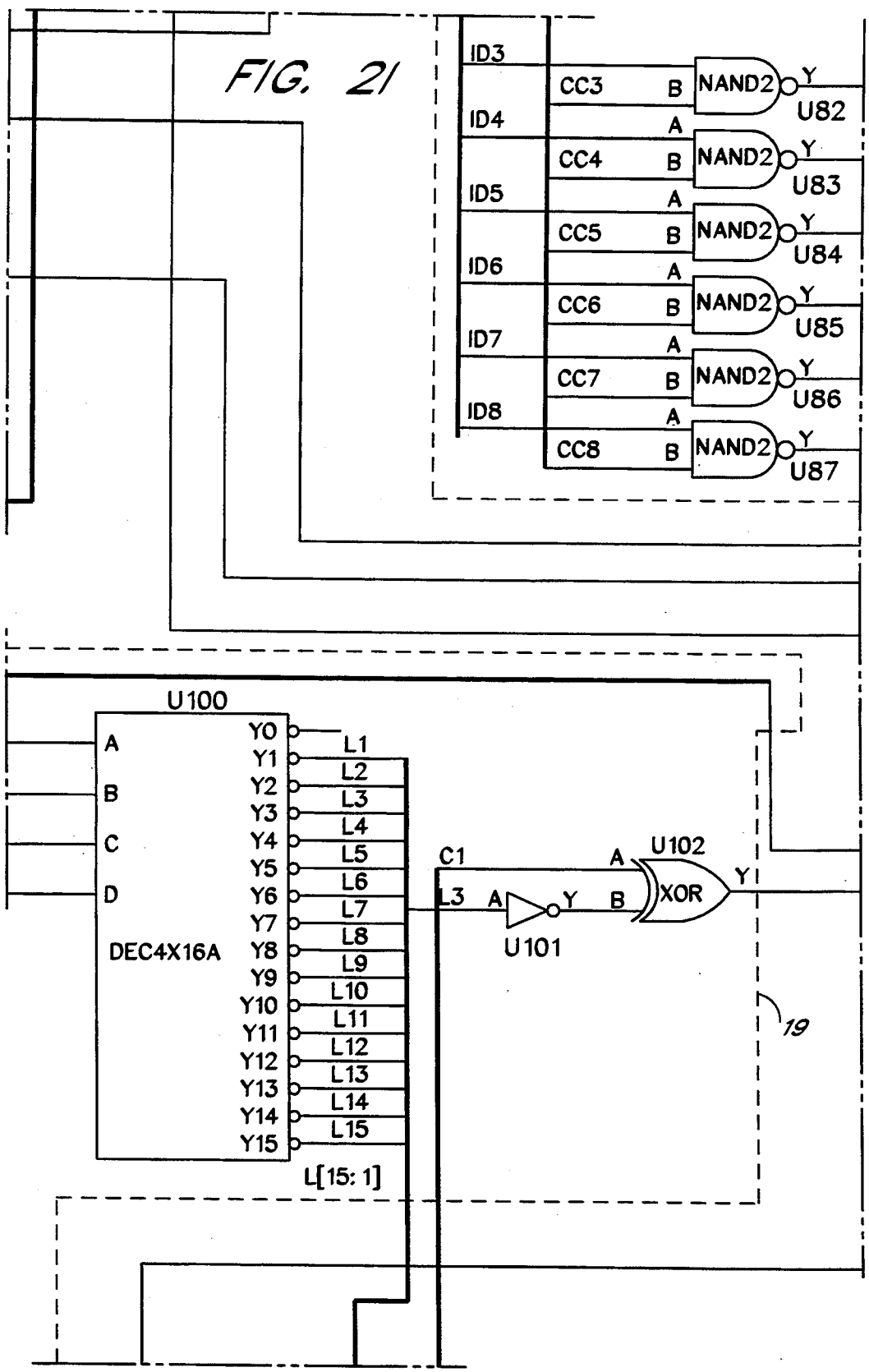
Figure 2J:
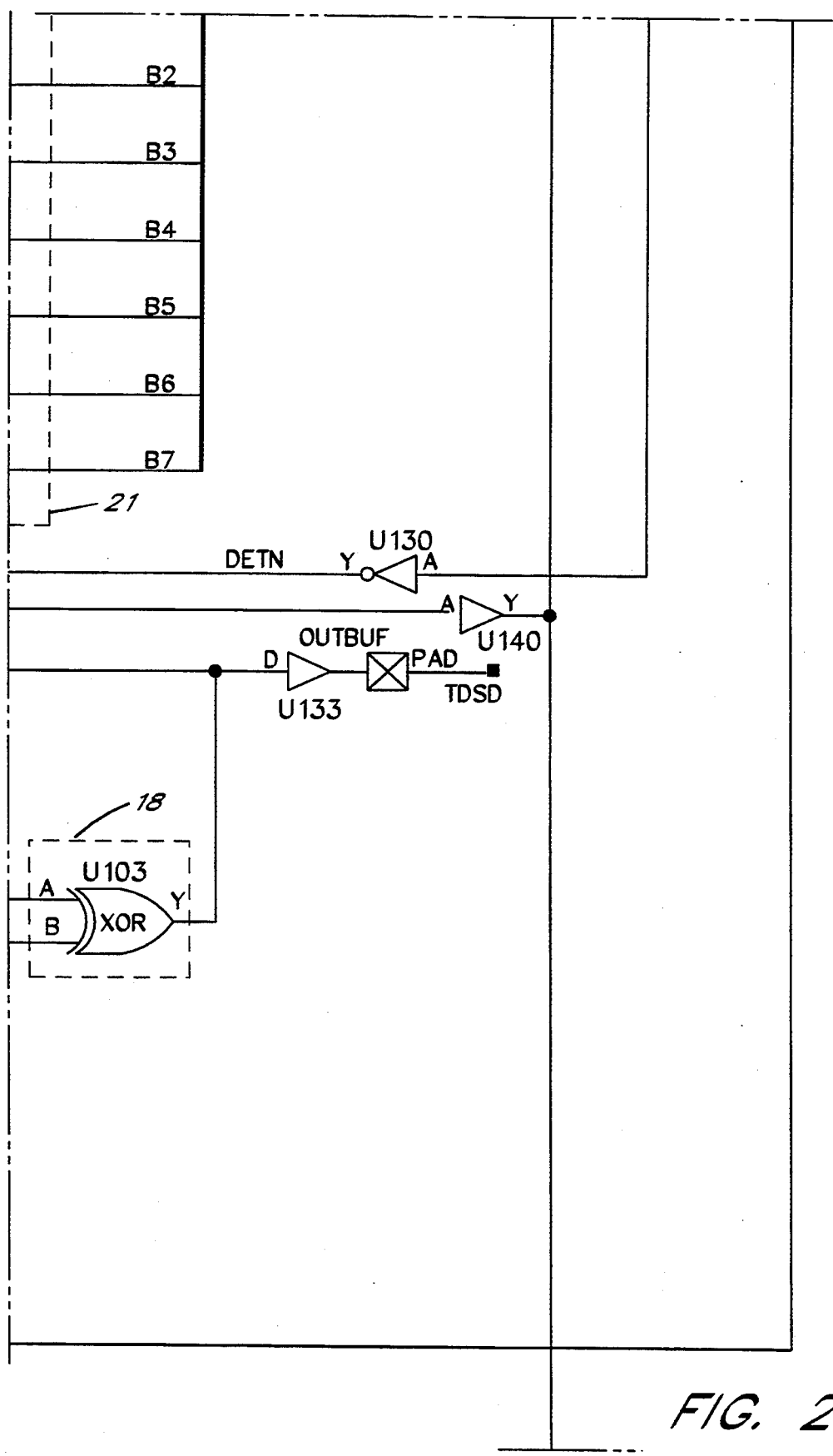
Figure 2K:
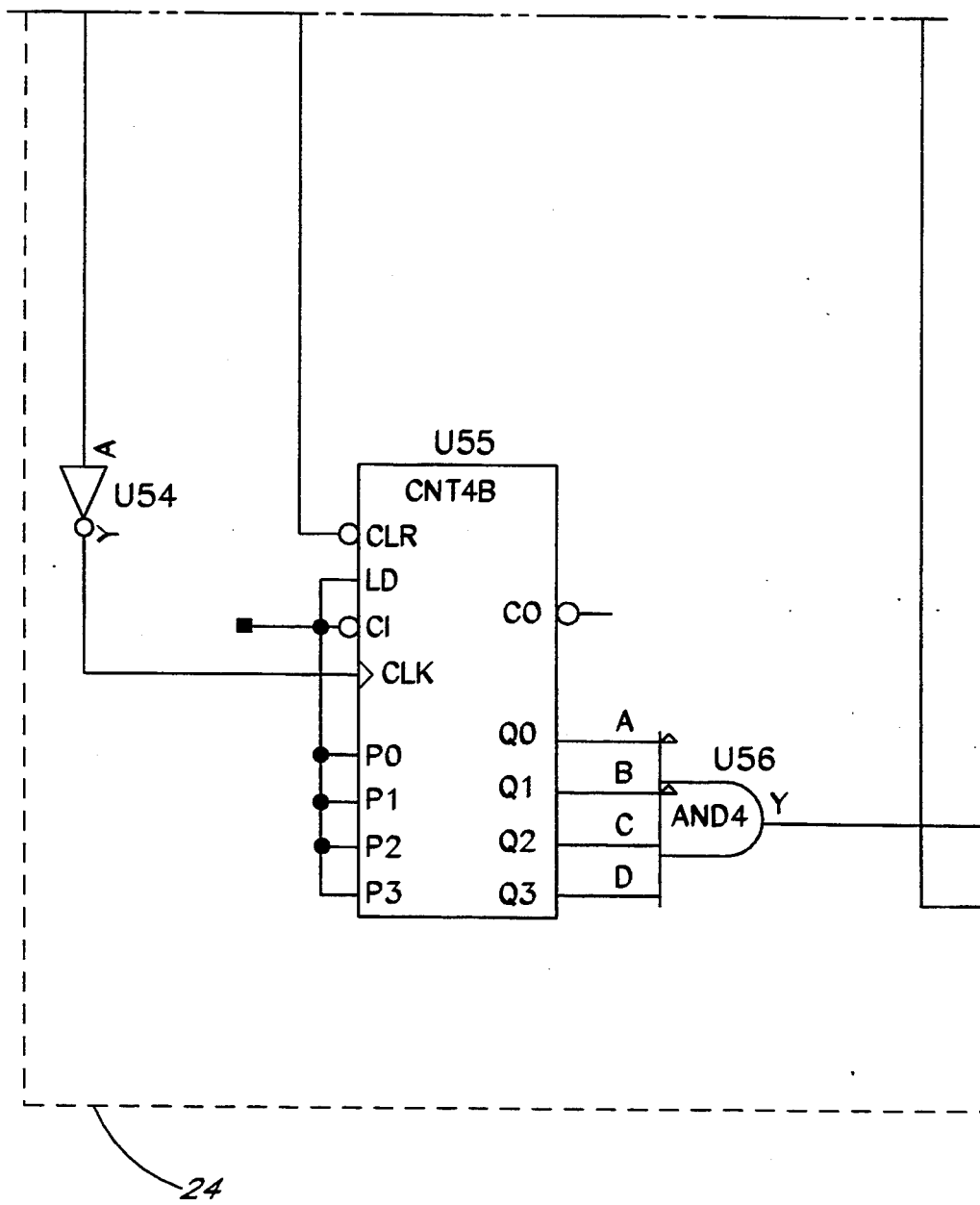
Figure 2L:
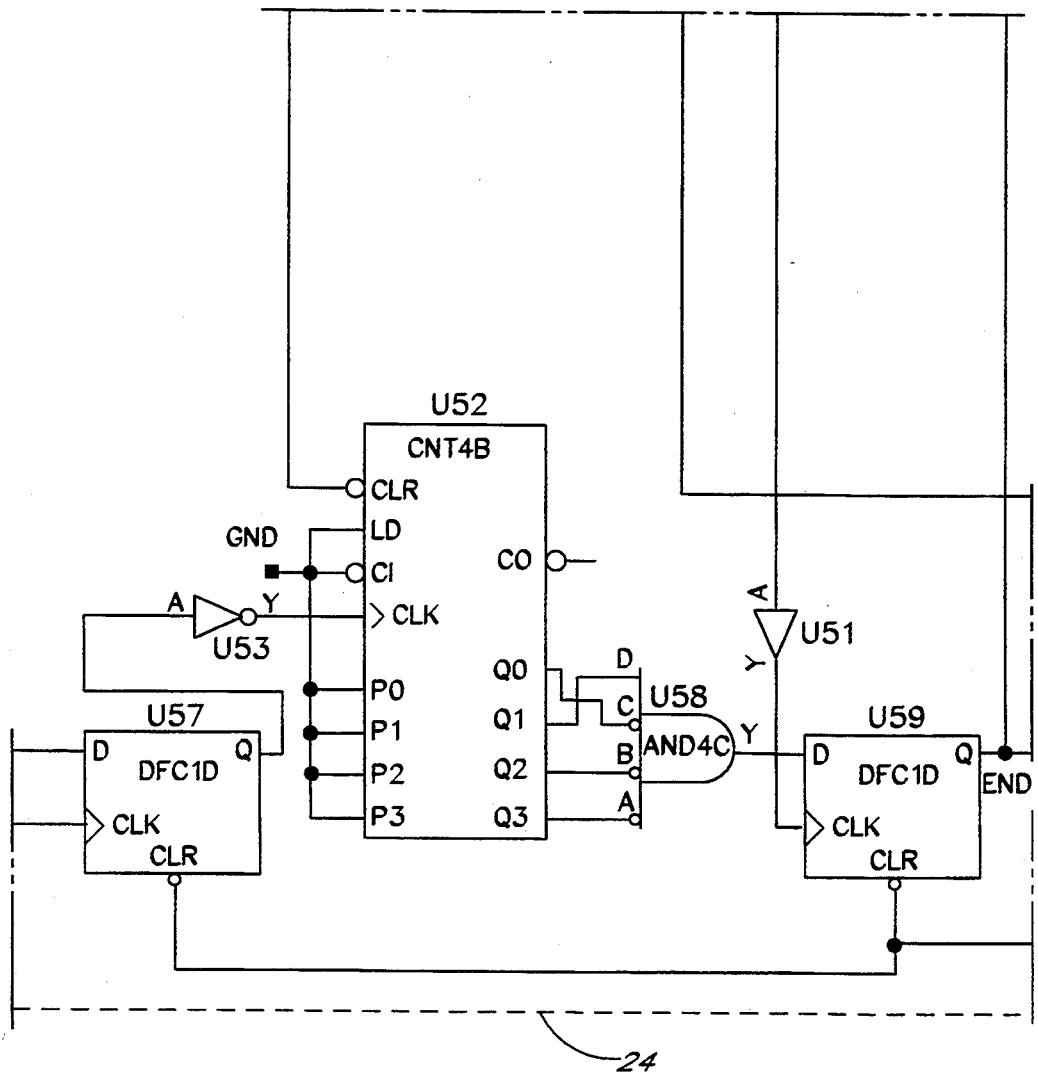
Figure 2M:
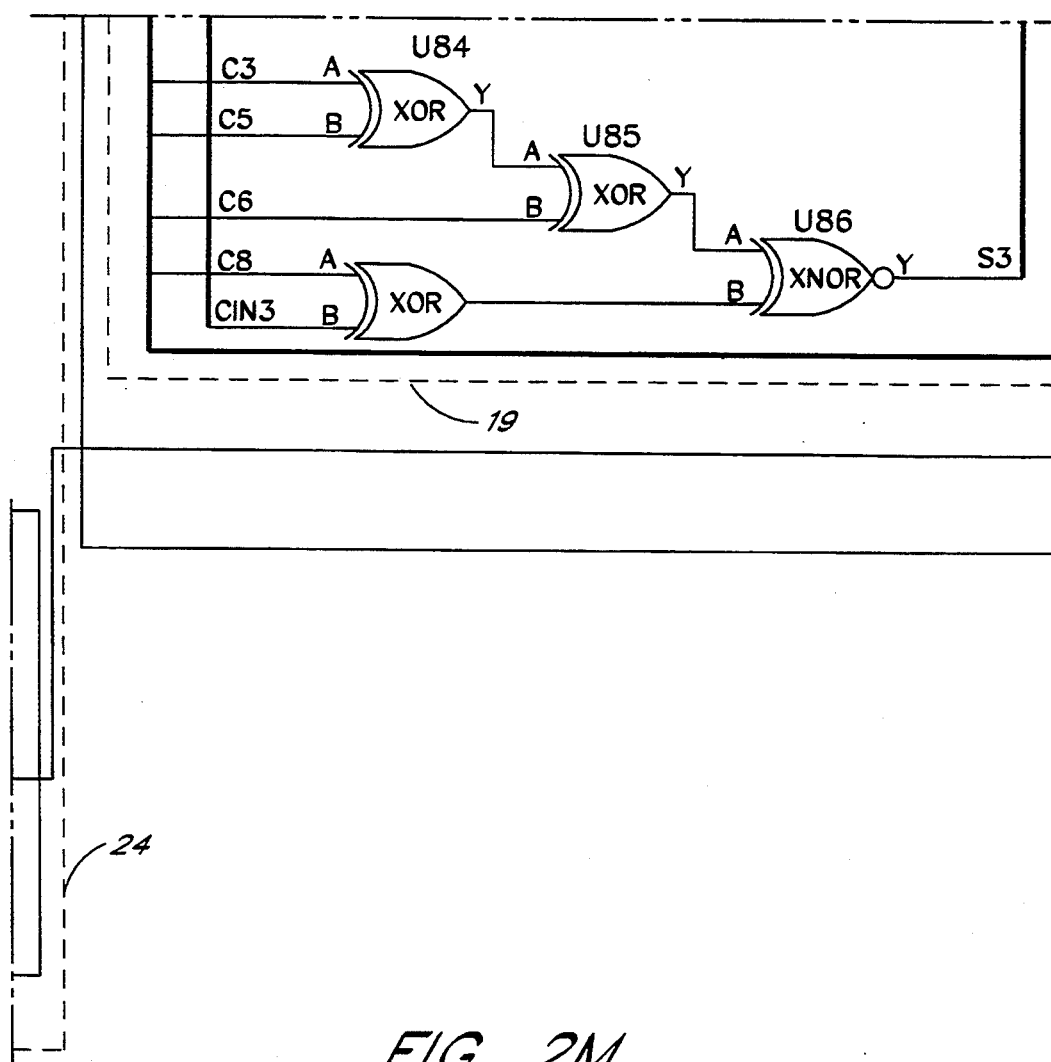
Figure 2N:
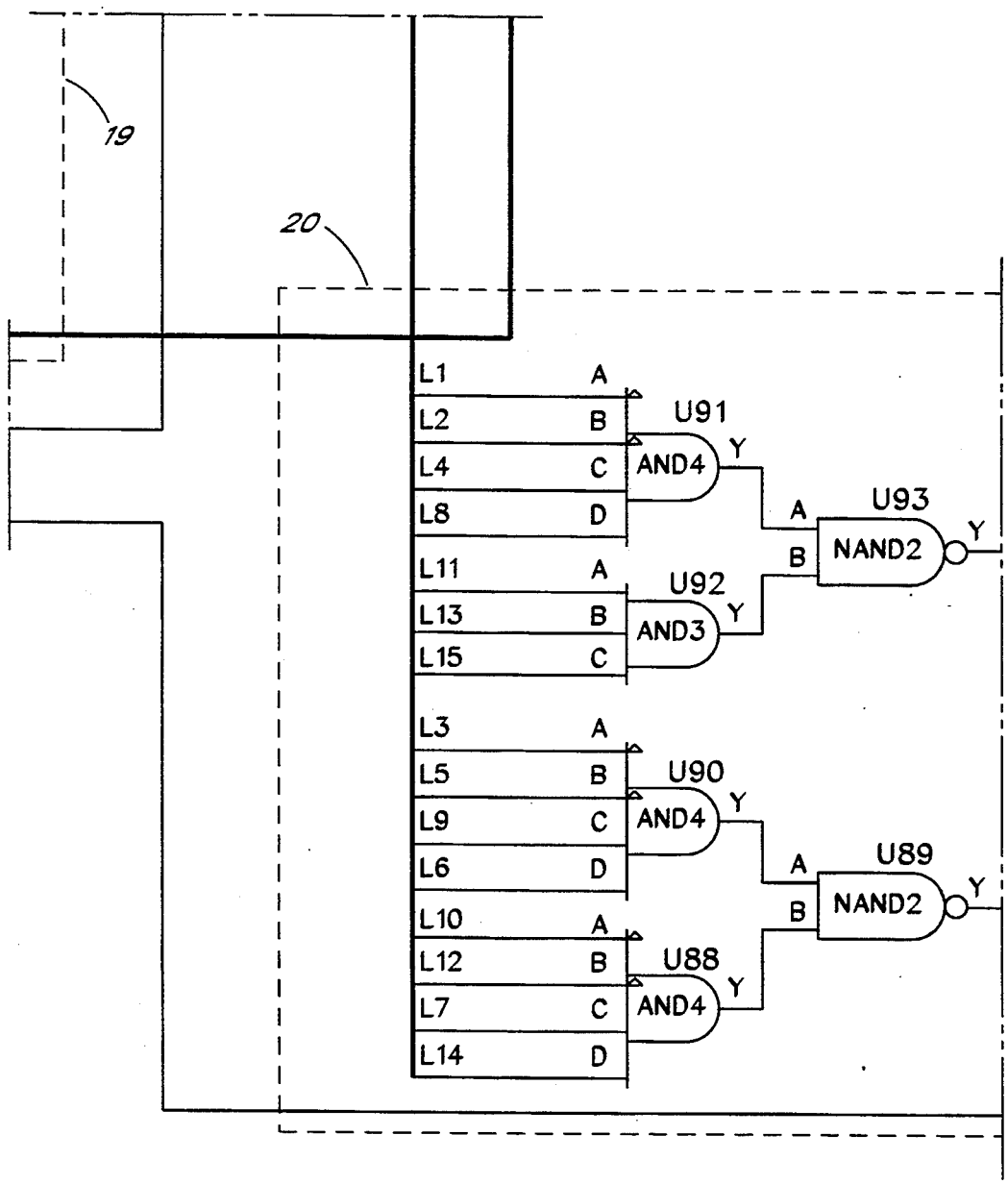
Figure 20:
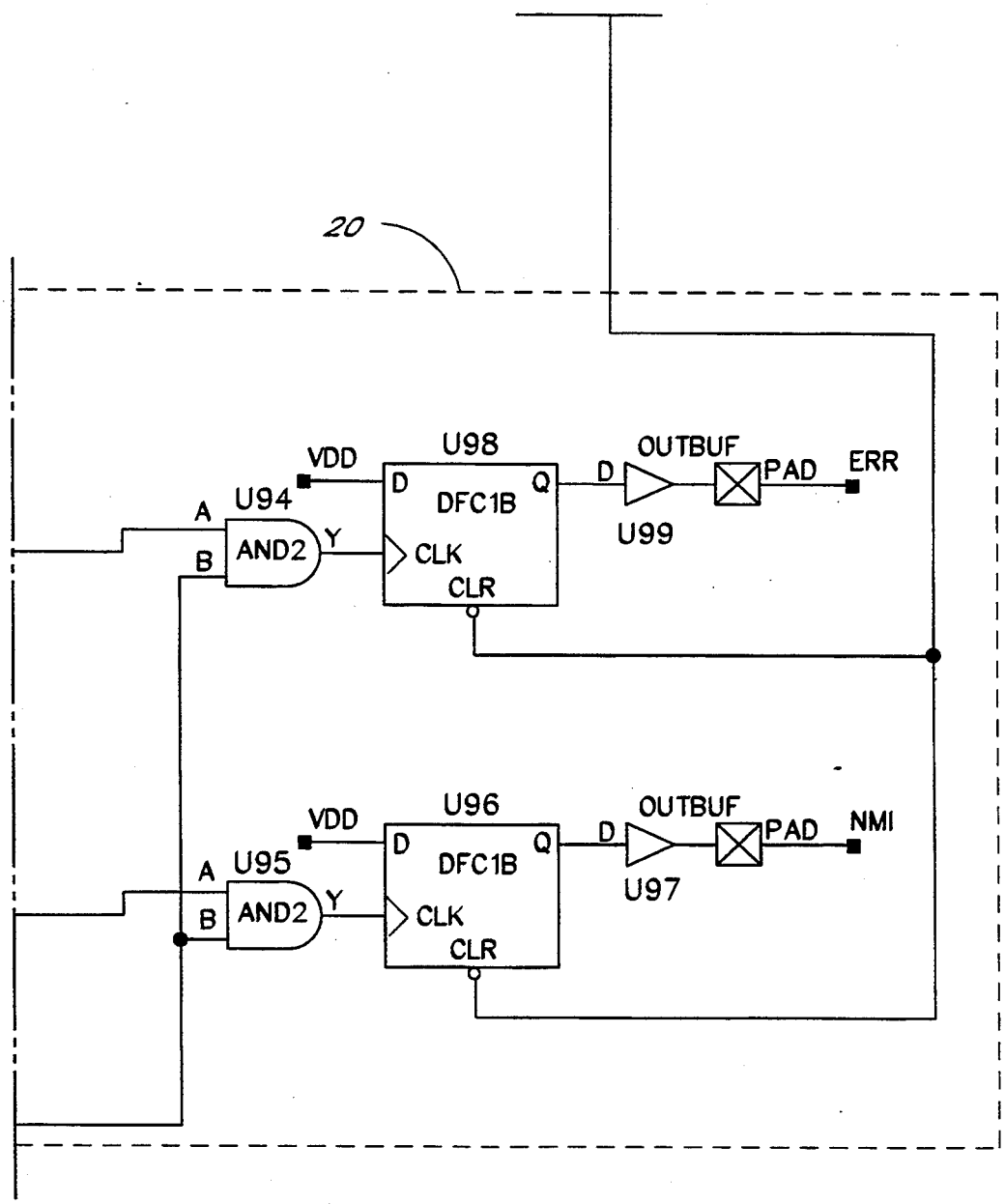
Figure 3A:
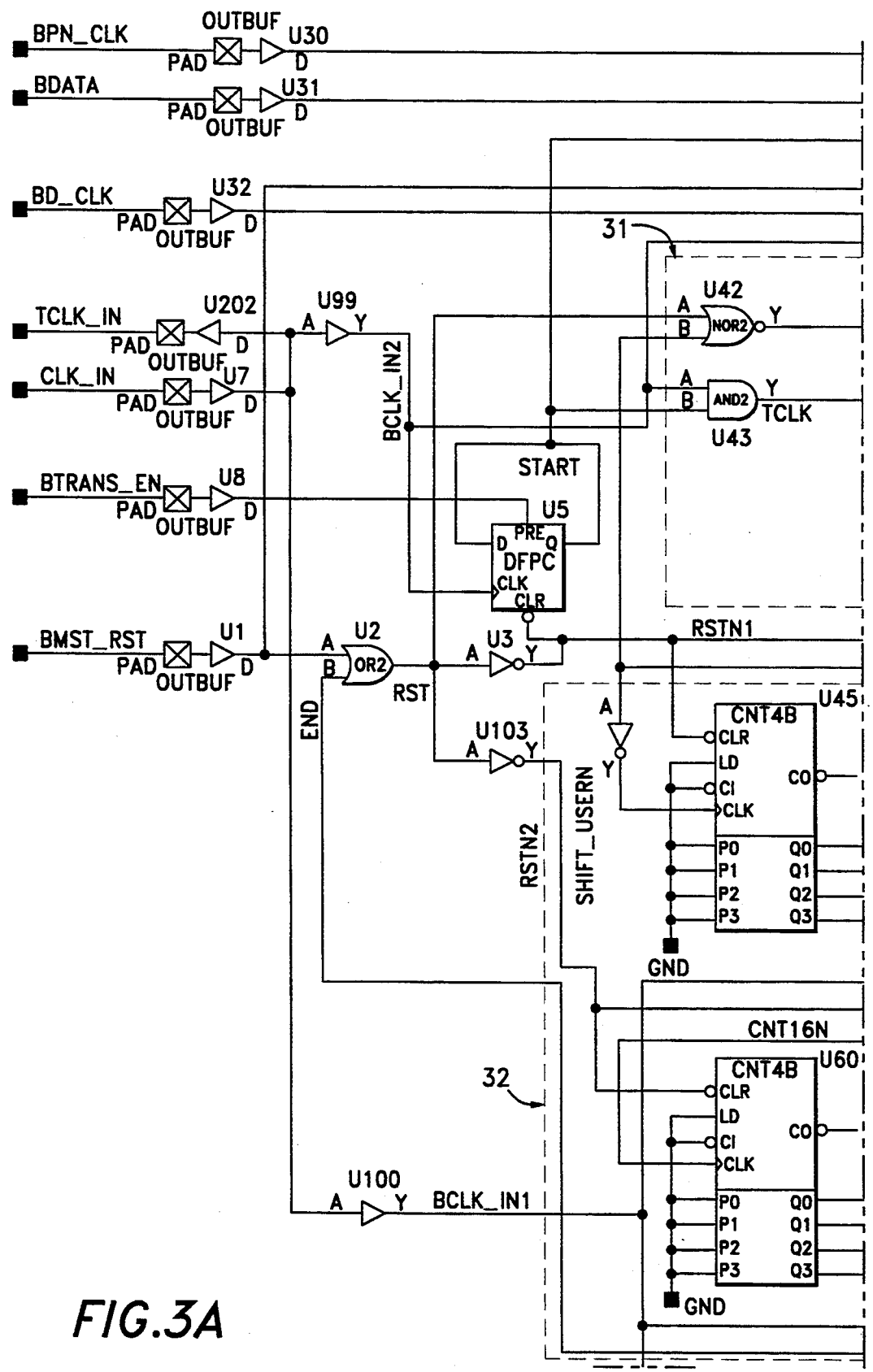
Figure 3B:
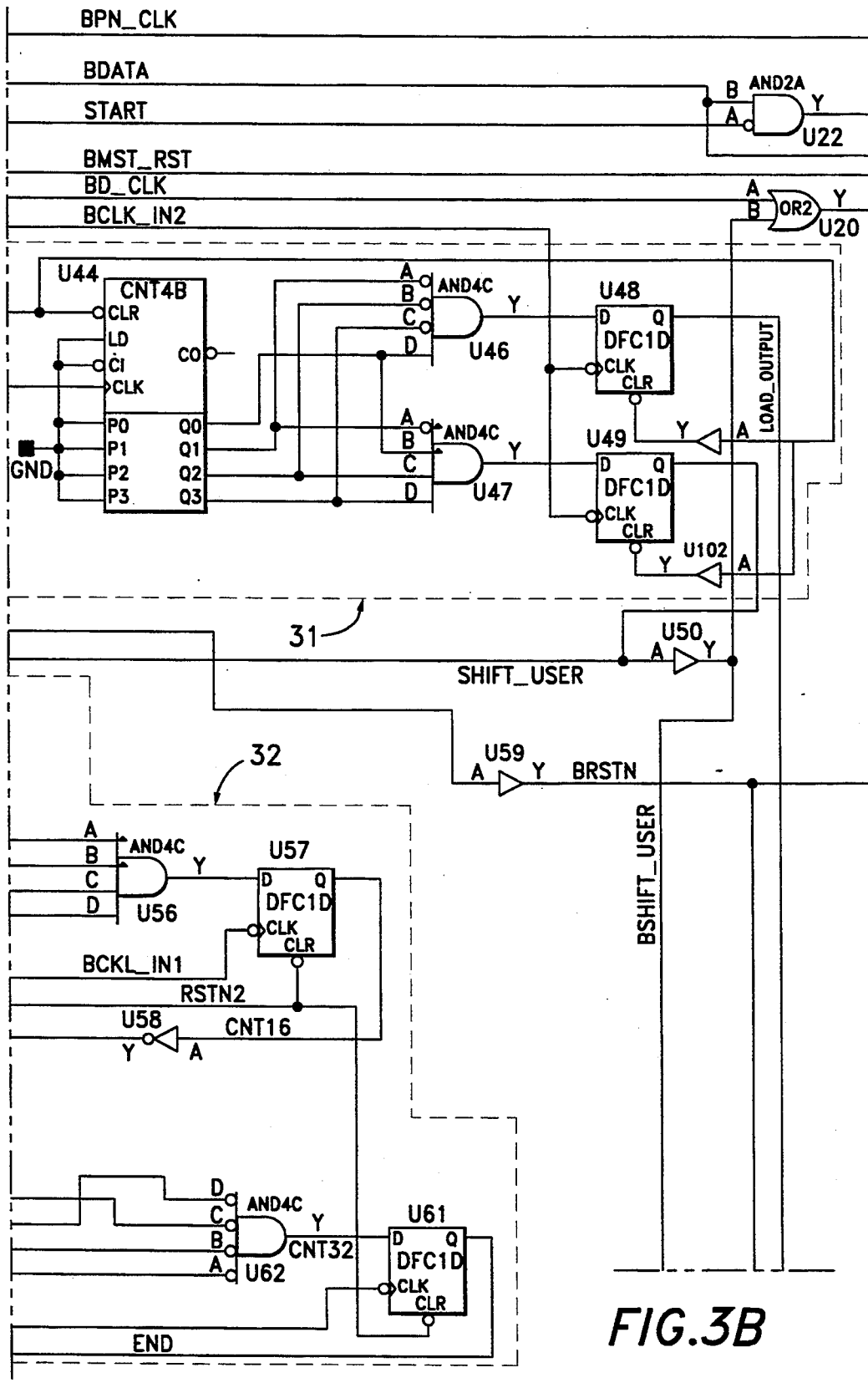
Figure 3C:
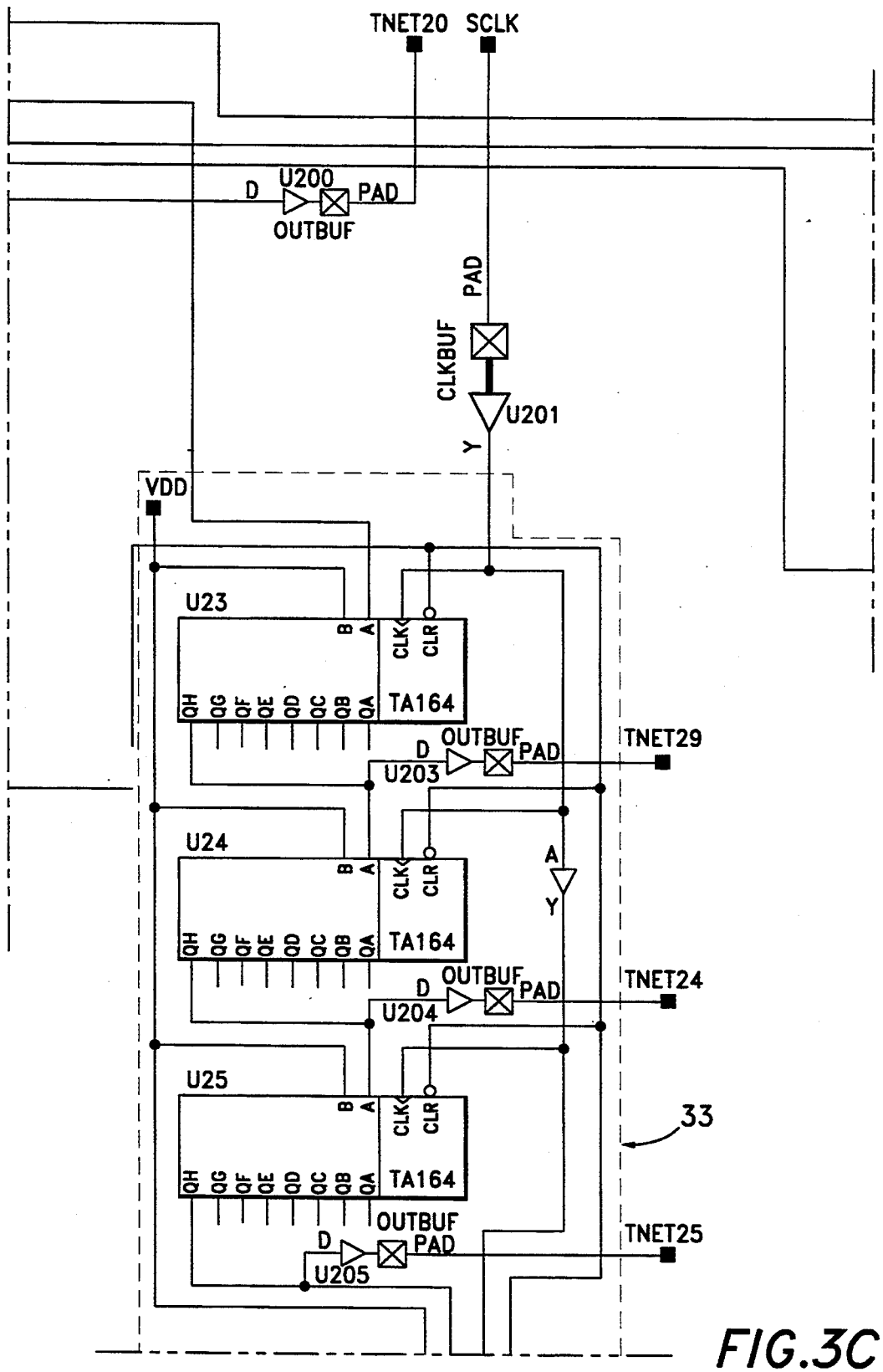
Figure 3D:
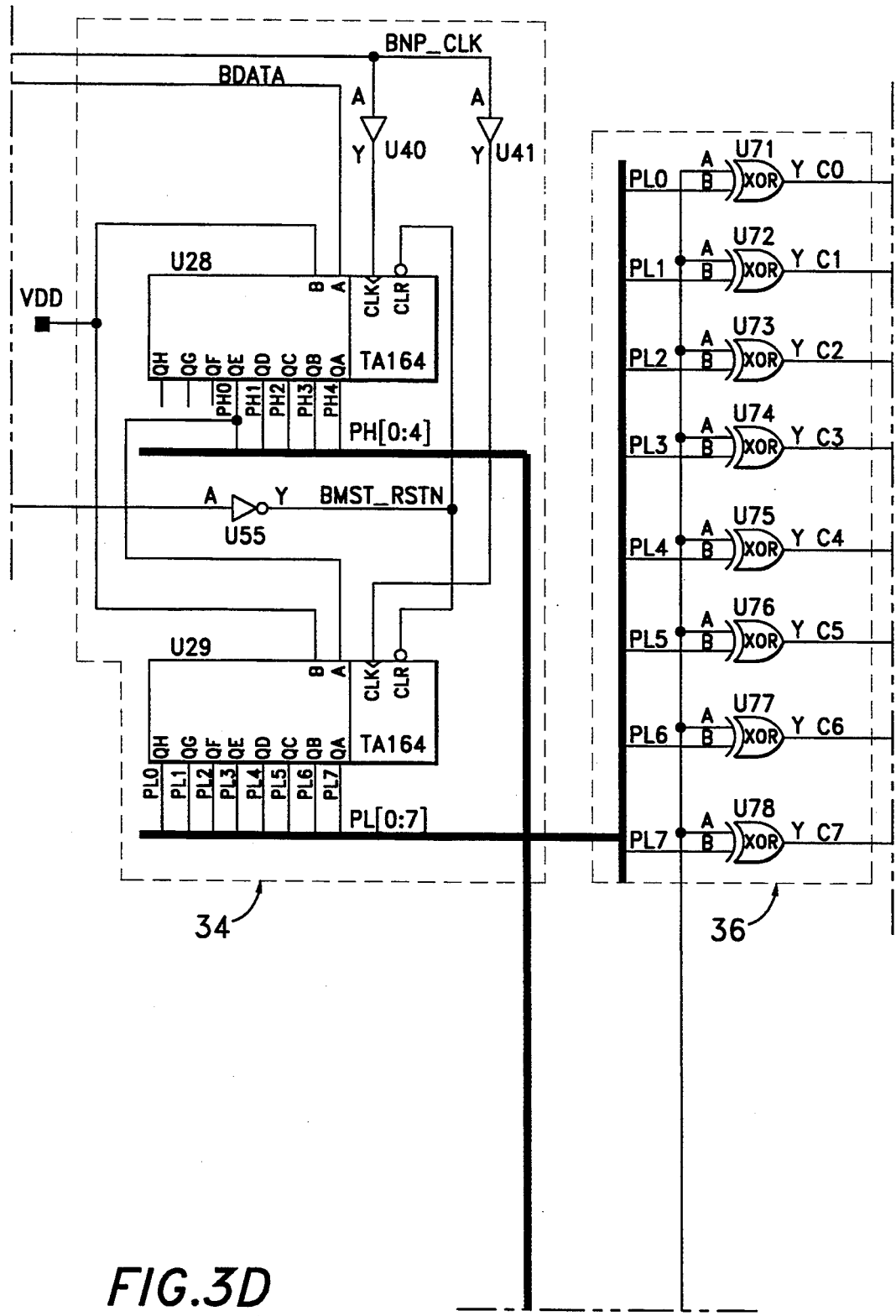
Figure 3E:
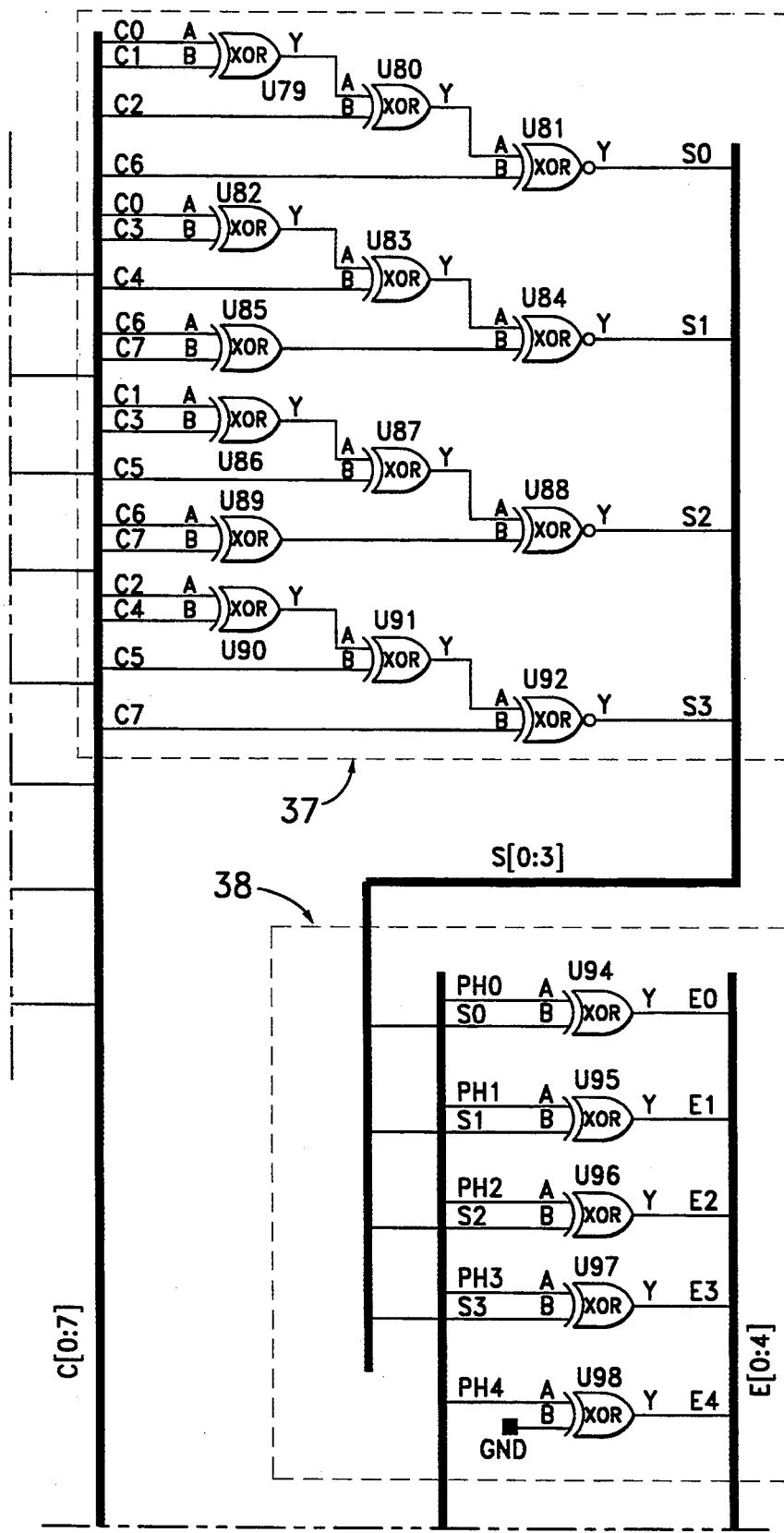
Figure 3F:
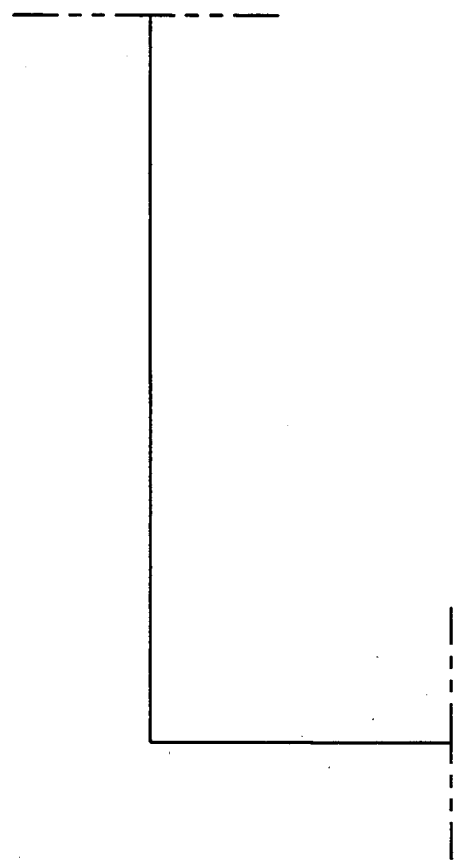
Figure 3G:
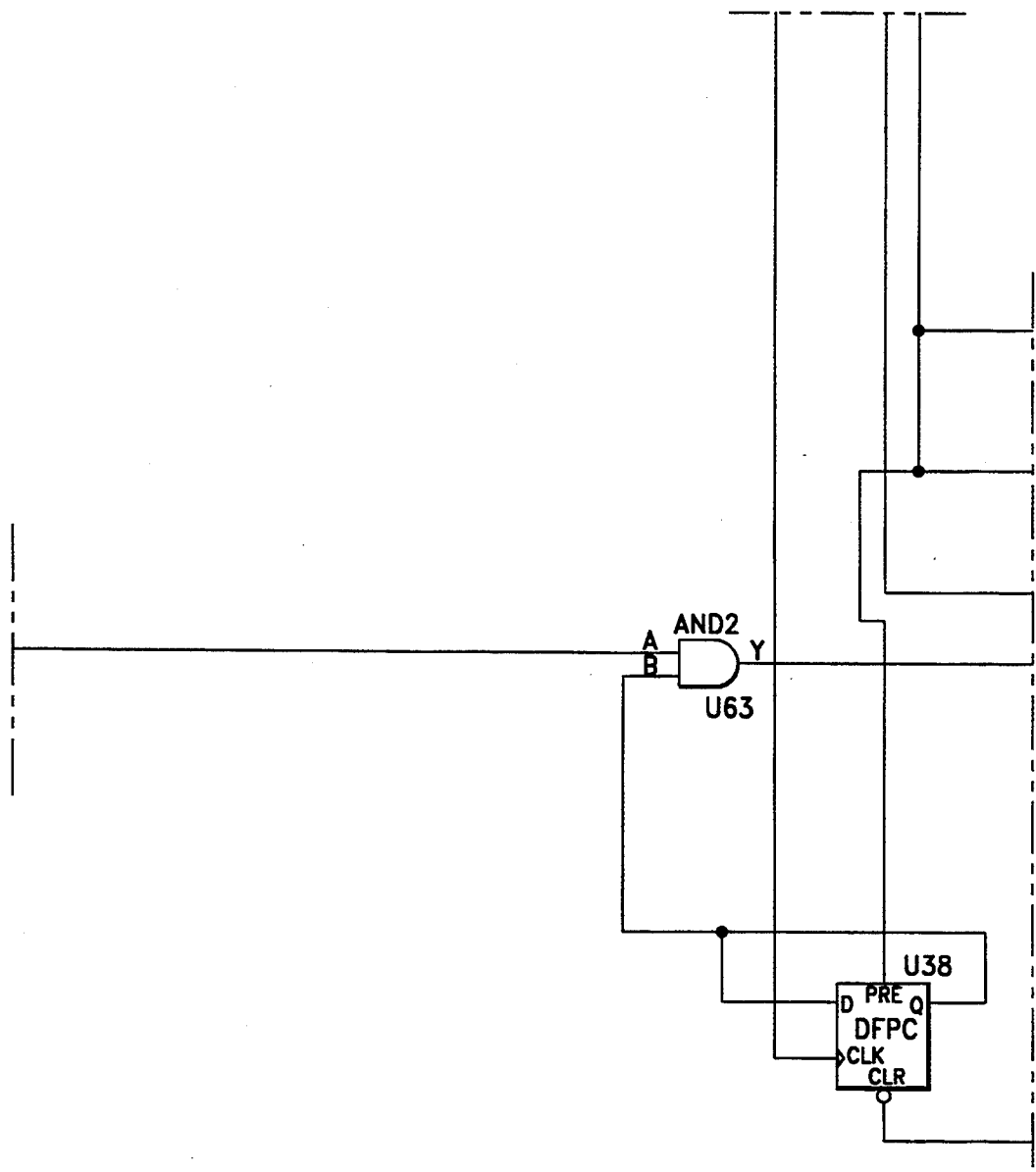
Figure 3H:
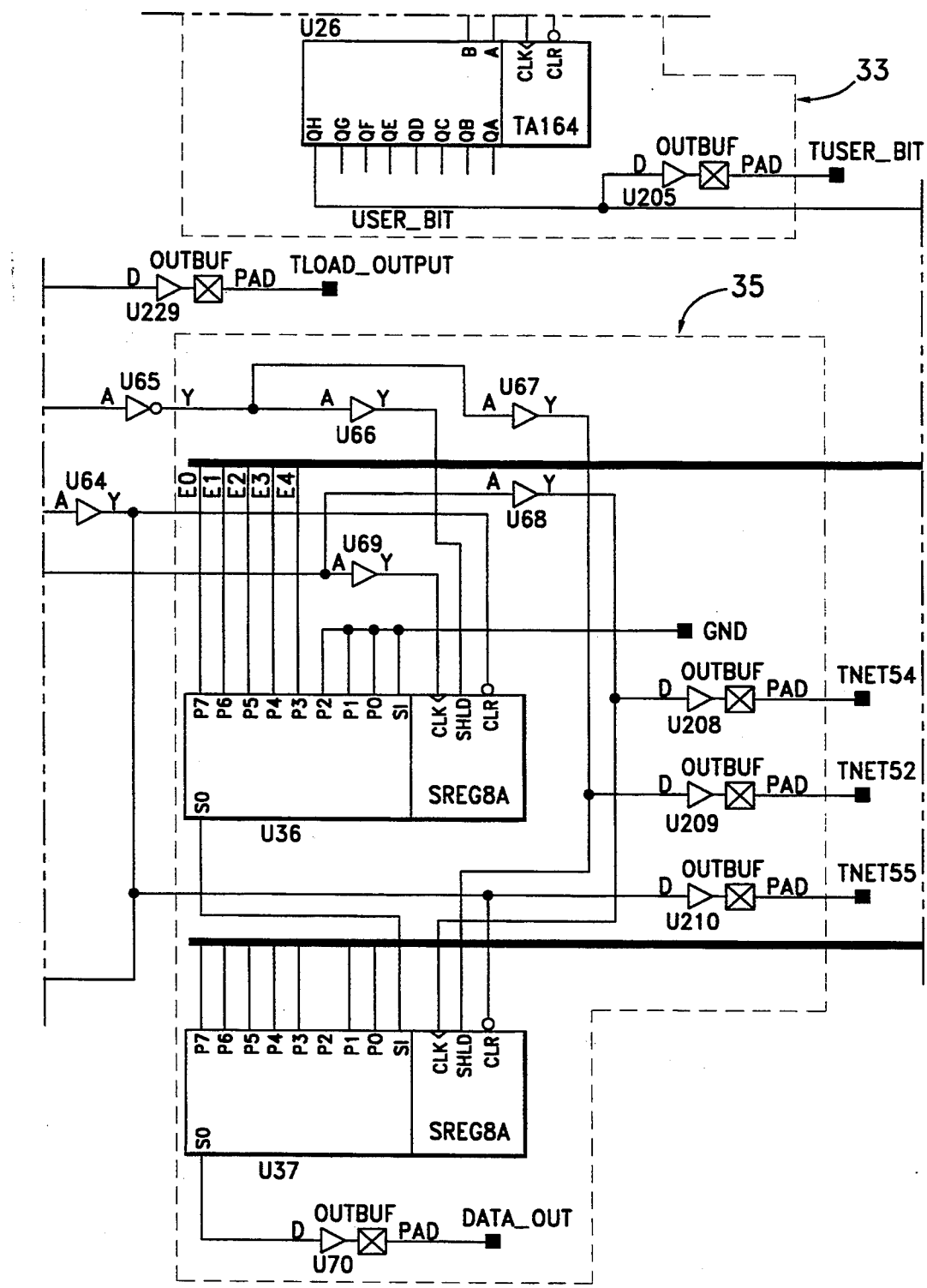
Figure 31:
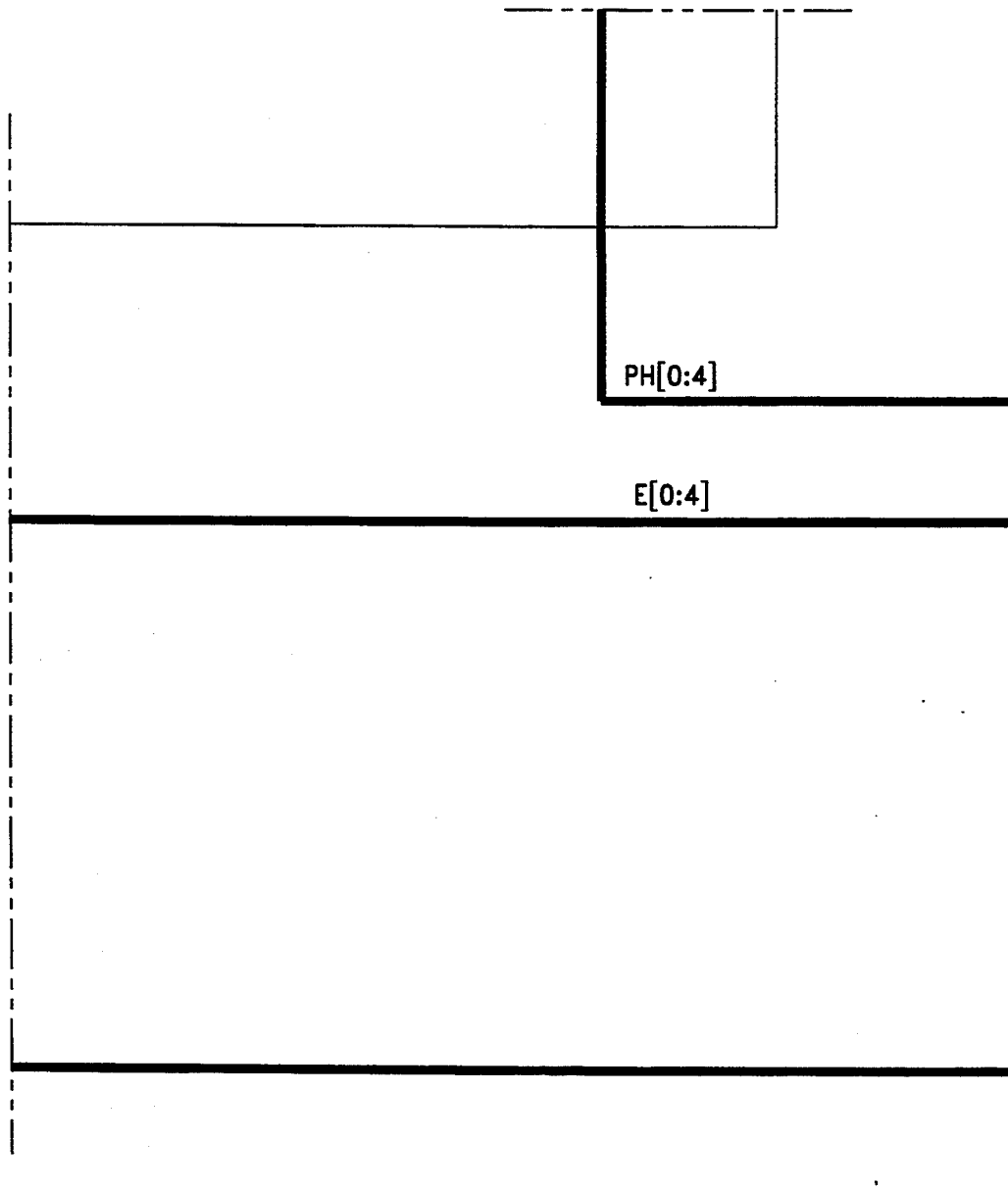
Figure 3J:
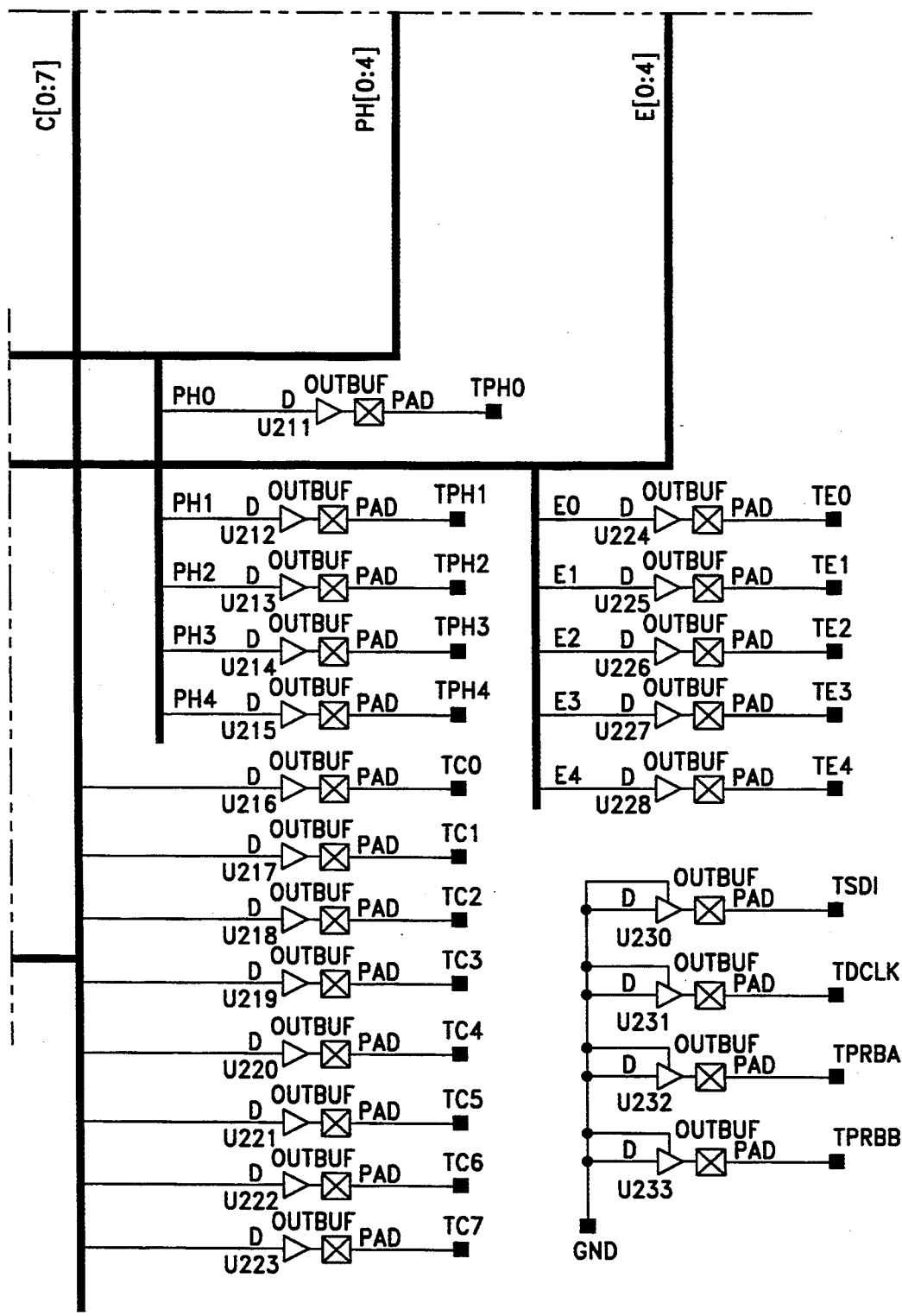
Figure 4A:
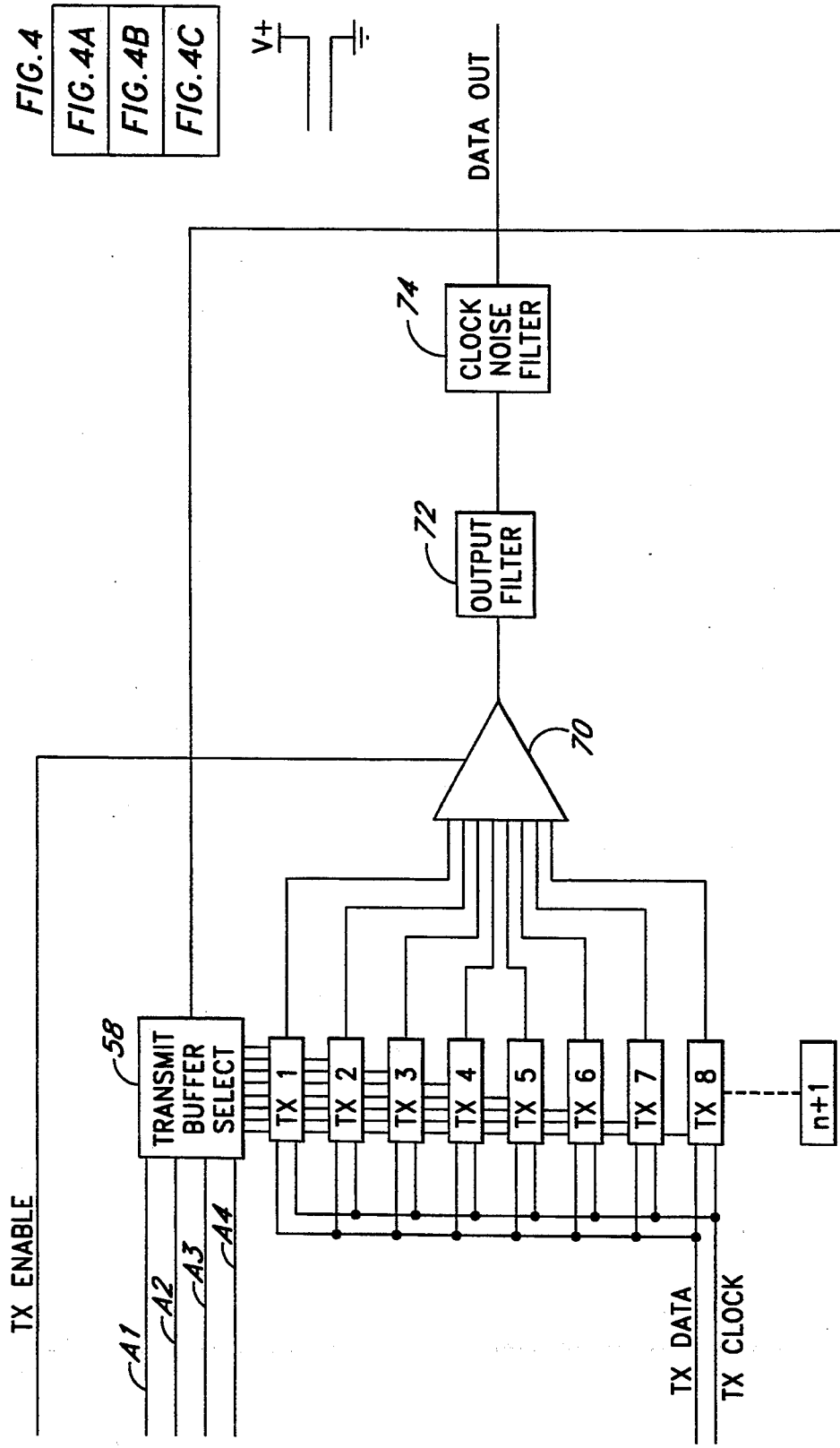
Figure 4C:
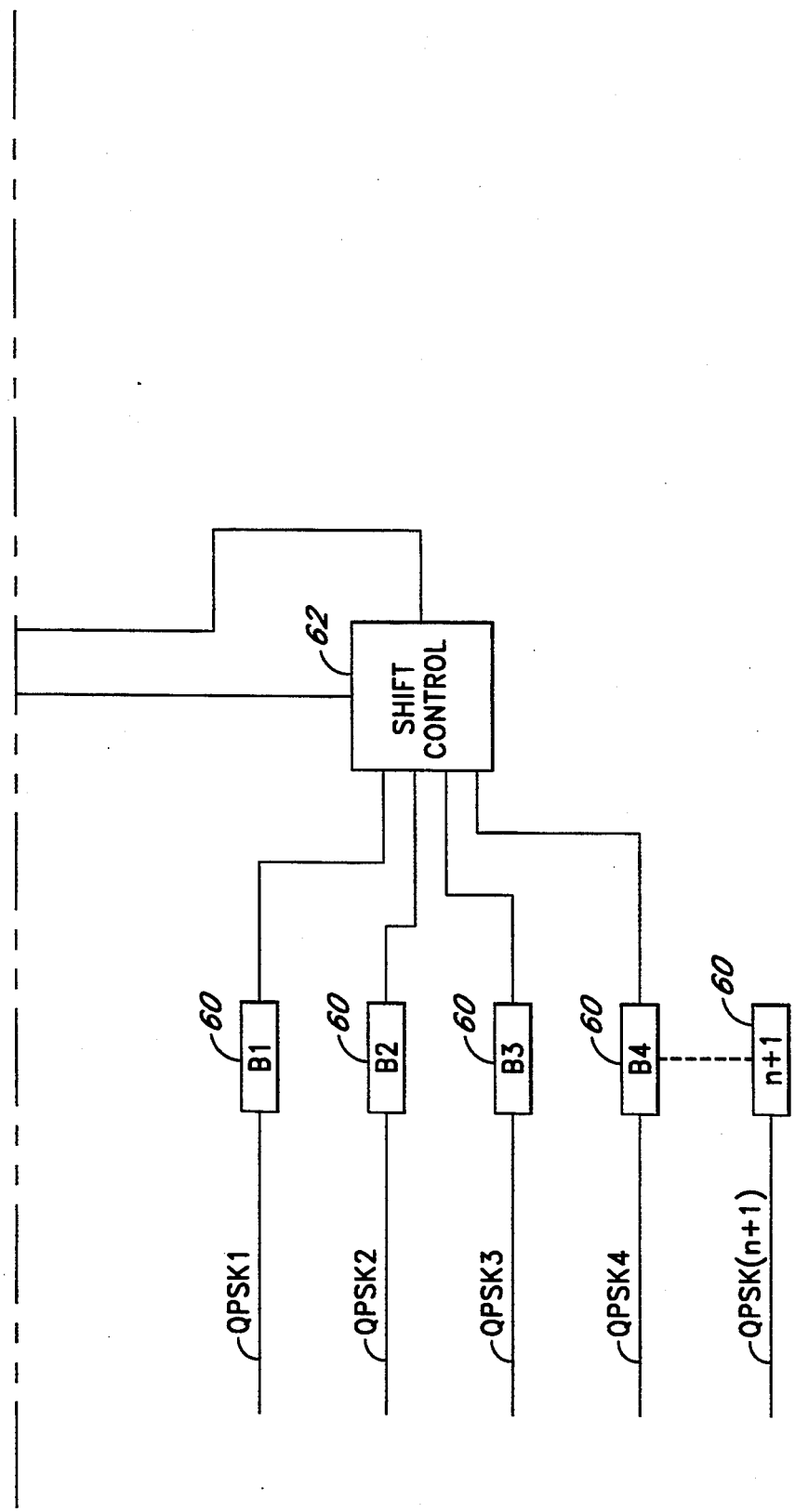

Turning to FIGS. 2 and 2A–2O, a circuit is shown according to the preferred embodiment and best mode of a receiver portion of the correlator according to the present invention. The schematic diagram is divided into a plurality of functional blocks 11–24. The detailed interconnection of electrical components within the functional blocks and operation thereof would be well known to a person skilled in the art. Accordingly, the detailed interconnections and descriptions of operation are not included herein.

In FIGS. 2 and 2A–2O, block 11 represents a shift register for receiving input data (S-DATA) to be de-spreaded. The shift register 11 assembles 13 chips for each bit of received data.

Block 12 represents a clock generation circuit for receiving the input data signal (S-DATA), and free running clock signal (X2) which operates at a frequency of at least twice the clock frequency utilized in the transmitter section of FIGS. 3 and 3A–3J (discussed in greater detail below). The free running clock signal (X2) is divided by two utilizing flip-flop U2. In response to receiving the input data signal (S-DATA) and free running clock signal (X2), the clock generation circuit 12 generates an adjusted clock signal (CLK) for application to the clock input of the shift register 11. Specifically, when flip-flop U30 is cleared (e.g. when either MST-RST or DET are at a logic high level as applied to AND gate U29), the Q output thereof goes to a logic low level. This signal is inverted and applied to the input of AND gate U28. The S-DATA signal is applied to the B input of AND gate U28, so that the logic high output signal generated therefrom when A and B inputs go high, is synchronized to the input data signal S-DATA. The logic high signal output from AND gate U28 clocks flip-flop U30 so that the Q output goes from a logic low to a logic high level in synchronism with the first input data chip. This signal is delayed via cascaded inverters U31–U34, the output of which is connected to the clock input of flip-flop 35. The divided free running clock signal is applied to the data output (D) of flip-flop U35 and also to both inputs of a multiplexer U36. The Q output of flip-flop U35 is connected to the select input (S) of multiplexer U36 for selecting either the true phase or the inverted phase of the divided clock signal. The output of multiplexer U36 is designated PLL (phase locked loop) and is applied to one input of AND gate U37. The other input of AND gate U37 is connected to the output of the cascaded delay inverters U31–U34. Since the divided clock signal is always applied to multiplexer U35 and since the signal from the Q output of flip-flop U35 is synchronized to the input data stream, then the output of AND gate U37 generates a recovered clock signal which is synchronized with the input data stream is less than 73.5 nanoseconds of receipt of the first data chip.

Functional block 13 represents a register for receiving a user PN code (DATA-IN) for de-spreading the received data (S-DATa). The PN code is loaded into the register 13 by means of a PN-CLK clock signal.

Registers 14 and 15 also receive the PN user code appearing on the DATA-IN terminal under control of the ID-CLK signal and the C-CLK clock signals respectively, whereas the PN user code data stored in register 13 is latched into the register under control of the PN-CLK clock signal.

The ID register 14 stores predetermined bits of the PN-CODE which constitute an identity address for the circuit of the present invention. This information is used for comparing the first eight de-spreaded bits, as discussed in greater detail below. The compare register 15 controls the number of bits to be compared between ID register 14 and storage buffer 16. Specifically, a logic high signal on any one of the outputs CC1 to CC8 results in the corresponding bit locations to be compared while a logic zero output signal on any one of outputs CC1 to CC8 results in no comparison of the corresponding bit locations. According to the circuit of FIGS. 2A–2O, only the first eight bits of received (de-spreaded) data are compared. In the event that the compared bits are identical, comparator circuit 23 generates a logic high output signal (DET-INT), as discussed in greater detail below.

As indicated above, storage buffer 16 is utilized for storing thirty-two de-spreaded data bits for comparison within logic circuit 22. Data is clocked out of buffer 16 by means of a system clock signal (DCLK) which can be at a lower frequency than the received clock signal (CLK) output from clock generator circuit 12.

The output D-DATA of buffer 16 is a serial data stream at CMOS voltage levels which is clocked out in accordance with the DCLK clock signal.

Syndrome chips are de-spreaded within a logic circuit 17, as discussed in greater detail below.

Corrected data bits are de-spreaded within EXCLUSIVE-OR gate 18, as discussed in greater detail below.

An error detection and correction circuit 19 outputs the corrected data signal for de-spreading via EXCLUSIVE-OR gate 18.

Section 20 generates control signals ERR and NMI such that when both ERR and NMI are at a logic low level, this indicates that the received data is error free; when ERR is at a logic low level and NMI is at a logic high level the received data contains an un-correctable error; when ERR is at a logic high level and NMI is at a logic low level, a correctable error has been detected within the received data stream; and when both ERR and NMI are at logic high levels, the received data contains an uncorrectable error.

Logic circuit 21 receives the identity signal from ID register 14 and the bit location data from compare register 15 and performs a logical AND between the respective signals for application to comparator circuit 23.

In logic circuit 22, the first sight data bits from output buffer 16 and the bit location information from compare register 15 are logically ANDED for application to comparator circuit 23.

Within comparator circuit 23, the output of logic circuits 21 and 22 are compared. In the event the compared bit pairs are identical, then, as indicated above, comparator circuit 23 generates a logic high output signal DET-INT.

Functional block 24 represents a bit counter which ensures that 32 bits have been processed from the received data stream.

The output D-DATA of buffer 16 is a serial data stream at CMOS voltage levels which is clocked out in accordance with the DCLK clock signal.

A logic high master reset signal MST-RST resets the circuitry in functional clocks 11, 12, 24, 16, 20 and 23, while a logic high register reset signal REG-RST resets all registers within the circuit. A logic high MST-RST signal initializes the circuit for receiving a new stream of input data S-DATA.

In operation, the register reset signal REG-RST is set at a logic high level for resetting the registers. Next, the PN register 13, ID register 14 and compare register 15 are loaded with appropriate user data under control of the respective input clock signals.

Once the PN register 13, ID register 14 and compare register 15 have been loaded, the MST-RST signal goes to a logic high level for initializing the circuit to receive an incoming stream of data S-DATA.

The incoming data stream S-DATA is received in sections 11 and 12. The clock generating circuit 12 locks onto the in-coming data and in response generates an output clock signal CLK with an appropriate phase, as discussed in greater detail above. Shift register 11 receives the incoming data S-DATA under control of the CLK clock signal such that the system locks onto the incoming data on the first received chip.

The syndrome chips output from shift register 11 are applied to logic circuit 17 for de-spreading by means of the user code data received from register 13. The syndrome chips are also applied to error correction and detection circuit 19 which operates on the received syndrome chips in conjunction with the de-spreaded signal from logic circuit 17 and presents a corrected chip signal output to EXCLUSIVE-OR gate 18 and to functional block 20. As discussed above, the circuitry of block 20 generates control signals ERR and NMI for indicating whether or not the received data contains errors, and if so whether the errors are correctable or not.

As discussed above, EXCLUSIVE-OR gate 18 receives and de-spreads the corrected chip data output from circuit 19 using the data output from PN register 13. The de-spreaded chip data is then stored within buffer 16 under control of circuit 24.

Logic circuit 21 then performs a logical AND of the ID address signal output from register 14 and the bit location data output from compare register 15, and outputs a signal to the compare circuit 23.

Also, as discussed above, the first eight data bits from buffer 16 and the bit location data from compare register 15 are logically ANDED in logic circuit 22, which, in response generates an output signal to a second input of comparator circuit 23.

Comparator circuit 23 compares the data signals input from logic circuits 21 and 22, and in response generates a logic high output signal DET-INT in the event that the two compared input signals are identical.

Turning now to the transmitter section of FIGS. 3A–3J, combined as shown in FIG. 3, a further plurality of functional blocks are shown, each containing a combination of well known circuit components.

Timing generator 31 receives a transmit clock signal (CLK) and in response generates SHIFT-USER and LOAD-OUTPUT control signals for ensuring each bit is spread into 13 chips prior to transmission, as discussed in greater detail below.

Functional block 32 represents a bit counter for ensuring that 32 bits are processed for transmission. Since 32 bits are transmitted with each stream of data, and each bit is spread into 13 chips, the total number of chips transmitted is 32×13=416 chips. The bit counter 32 receives the SHIFT-USER input from timing generator 31 as well as an input clock signal CLK-IN which is an external free running clock which regulates the speed of transmission of chips from the transmitter.

Data to be transmitted is stored in buffer 33 in serial format. The transmit data is loaded into buffer 33 under control of an external clock signal SCLK. A user PN code is stored within register 34 in serial format, the data being received on a DATA input pin and clocked into the register under control of a clock signal PN-CLK.

Therefore, the incoming data signal is applied to both the data register 33 and PN register 34 under control of the appropriate clock signals (S-CLK or PN-CLK) for directing the data to the appropriate section.

The chips to be transmitted are loaded into transmit section 35 in parallel format and shifted out therefrom serially.

Logic circuit 36 is utilized for spreading out each bit of data received from data register 33 into a plurality of chips using the PN code received from PN register 34.

In logic circuit 37, the signal output from logic circuit 36 is logically processed for generating syndrome bits for error detection and correction, which are then applied to logic circuit 38 and spread therein using the PN code received from register 34.

In operation, a logic high master reset signal MST-RST is used to reset all registers and flip-flops in the transmitter circuit. Next, the user data and PN code are loaded into the data register 33 and PN register 34, respectively, in serial format under control of the appropriate clock signals, as discussed above. Once the data register 33 and PN register 34 have been loaded, a logic high signal TRANS-EN is generated for enabling the shifting out of chips, one at a time, for transmission. Specifically, upon receipt of the TRANS-EN signal, bits are presented from data register 33 to logic circuit in a bit wise format. Logic circuit 36 spreads the bits into chips and presents the output signal to output circuit 35 for shifting out via a DATA-OUT port in serial format. The spread signal output from logic circuit 36 is also applied to logic circuit 37 as discussed above, for generating syndrome bits for error correction. The syndrome bits output from logic circuit 37 are spread using circuit 38.

The output of circuit 38 is also applied to output circuit 35. Upon receipt of a command signal from circuit 31 (LOAD-OUTPUT), the parallel data presented to output circuit 35 is loaded in for serial output shifting.

The signals appearing on DATA-OUT pin of section 35 are serial and CMOS compatible.

Turning to FIGS. 4, 4A, 4B and 4C, an alternative embodiment of the invention is shown for use with spread spectrum data communications in which the incoming data signal is received on a delayed basis on different channels (i.e. each bit being divided into separate chips) but can be used for TDMA or other modulation schemes. The separate constituent bit components or chips (RD1–RD8) are received in respective ones of receive buffers RX1–RX8. As shown, fewer or greater than eight receive buffers may be used in circumstances where each data bit comprises more or less than eight chips.

A majority voting circuit 40 generates an affirmative output signal in the event that the majority of the receive buffers RX1–RX8 contain valid data. This is useful in the event that one or more of the chip channels are jammed, yet the majority of chips are received, in which case the data bit is deemed to have been received.

The single bit output from the majority voting circuit 40 is applied to the receive data synchronization circuit 42 as well as to the clock recovery circuit 43 (shown comprising clock sync adjust circuit 44, auto clock generator 46 and clock delay jitter adjust circuit 49).

The clock sync adjust circuit 44 of clock recovery circuit 43 causes the buffers RX1–RX8 to receive incoming data or signal and to shift out the received data to majority voting circuit 40. The free running clock is adjusted in the manner discussed above with reference to FIG. 1 and the adjusted clock signal is applied to the receive data synchronization register 42 for latching the output bit from majority voting circuit 40 into FIFO 50 as well as into auto correlator circuit 52. The resultant data bit applied to auto correlator 52 is compared with a user data bit output from PN code latch 54. In the event that the bit signals are the same, auto-correlator 56 generates the correlation detect signal DET, indicating the correlation has been achieved or data has been de-spreaded. The data from FIFO 50 can be shifted out by the user using the data clock.

As discussed above in connection with the preferred embodiment of FIGS. 2, 2A-2O, 3 and 3A-3J, and as shown in the alternative embodiment of FIGS. 4, 4A, 4B and 4C, the derived clock signal may also be used to transmit output data. Specifically, the clock signal may be applied to a transmit buffer select circuit 58 in order to synchronize transmission of constituent chips of a transmit data signal stored within parallel transmit buffers TX1-TX8. In particular, address signals A1-A4 are used to address predetermined ones of the transmit buffers TX1-TX8 in synchronization with the derived clock signal from the incoming data stream. The transmit data signal is serialized via circuit 70 and then filtered via filters 72 and 74 and output on the DATA OUT terminal.

As an alternative to the serial embodiment of FIG. 4, the incoming data bits can be fed in parallel to auto-correlator 52 and compared to the user code received from latch 54 also in parallel. Also, FIFO 50 may be read by the host microprocessor off-line such that the high chip rates are independent of the speed of the microprocessor.

When using a QPSK modulation scheme, in order to receive incoming data into the buffers 60, the shift control circuit 62 is used to shift in two or more bits in sequence as required by a particular application. The output of the shift control circuit 62 is then transmitted to the receive data sync circuit 42 under control of the free running clock (i.e. clock recovery circuit 43).

In summary, a self synchronizing and automatic correlator system is provided for enabling synchronization and automatic correlation of incoming data, such as spread spectrum or other types of modulated data. The data can be in the form of a chip, bit, byte or a word of any length. The system also functions to synchronize incoming analogue signals, and can be implemented in hardware and/or software. The system may function independently of a host controlling device such as a micro-controller, thereby operating independently of the host system clock.

In addition, the system may be implemented in applications where data is stored as well as retrieved. For example, in hard disk storage, prior art methods require a large preamble bit sequence to store data. The system of the present invention may be utilized to reduce the preamble bit sequence and thereby increase the effective data storage capacity of a hard disk drive on a computer system.

Furthermore, the user data (i.e. user code) can be presented to the correlator statistically and/or dynamically by using the clock signal derived from the clock recovery circuit.

All such embodiments and variations are believed to be within the sphere and scope of the present invention as defined in the claims appended hereto.

We claim:

1. A self synchronizing automatic correlator that receives an input data signal from a source of an input data stream, said correlator comprising:
   a) means for receiving said input data signal;
   b) means for receiving a free running clock signal;
   c) a clock recovery circuit for comparing said input data signal and said free running clock signal and generating a phase error signal responsive thereto, and for phase adjusting said clock signal by an amount equal to said phase error signal and in response generating a recovered clock signal synchronized to said input data signal;
   d) a shift register for receiving and storing said input data signal under control of said recovered clock signal;
   e) storage means for storing a user data signal;
   f) comparing means connected to said shift register and said storage means for comparing said input data signal and said user data signal and in the event of a match therebetween generating an output signal for indicating valid detection of said input data signal wherein said clock recovery circuit comprises;
   g) a first AND gate having a pair of inputs and an output, one of said inputs being connected to said means for receiving said input data signal;
   h) a first flip-flop having a data input connected to a source of constant voltage, a clock input connected to the output of said first AND gate, and an output connected to the other one of said pair of inputs;
   i) a second flip-flop having a data input connected to said means for receiving said free running clock signal, a clock input connected to the output of said first flip-flop, and an output;
   j) a multiplexer having a first input connected to said means for receiving said free running clock signal, a second inverted input also connected to said means for receiving said free running clock signal, a control input connected to the output of said second flip-flop, and an output;
   k) delay means having an input connected to the output of said first flip-flop, and an output for carrying a delayed signal output from said first flip-flop; and
   l) a second AND gate having a first input connected to the output of said delay means, a second input connected to the output of said multiplexer, and an output for generating said recovered clock signal.

2. A self synchronizing automatic correlator that receives an input data signal from a source of said input data stream, said correlator comprising:
   a) means for receiving said input data signal;
   b) means for receiving a free running clock signal;
   c) a clock recovery circuit for comparing said input data signal and said free running clock signal and generating a phase error signal responsive thereto, and for phase adjusting said clock signal by an amount equal to said phase error signal and in response generating a recovered clock signal synchronized to said input data signal;
   d) a shift register for receiving and storing said input data signal under control of said recovered clock signal;
   e) storage means for storing a user data signal;
   f) comparing means connected to said shift register and said storage means for comparing said input data signal and said user data signal and in the event of a match therebetween generating an output signal for indicating valid detection of said input data signal wherein said storage means comprises;

g) a PN register for storing a first portion of said user data signal comprising a PN code;

h) an ID register for storing a second portion of said user data signal comprising an identification code; and i) a compare register for storing a third portion of said user data signal comprising a compare bit code.

3. The self synchronizing automatic correlator of claim 2 further comprising first logic circuit means for receiving said PN code from said PN register and said input data signal from said shift register and in response generating a plurality of de-spreaded syndrome bits.

4. The self synchronizing automatic correlator of claim 3 further comprising an error detection and correction circuit for receiving said input data signal from said shift register and said de-spreaded syndrome bits from said first logic circuit and in response generating a corrected input data signal.

5. The self synchronizing automatic correlator of claim 4 further comprising a second logic circuit for receiving said input data signal and said corrected input data signal and in response generating a de-spreaded corrected input data signal.

6. The self synchronizing automatic correlator of claim 5 further comprising a data register for receiving and storing said de-spreaded corrected input data signal.

7. The self synchronizing automatic correlator of claim 6 further comprising a third logic circuit for performing a logical AND between a first predetermined number of bits of said de-spreaded corrected input data signal stored in said data register with corresponding bits of said identification code stored in said ID register and in response generating a first ANDed signal.

8. The self synchronizing automatic correlator of claim 7 further comprising a fourth logic circuit for performing a logical AND between respective bits of said compare bit code stored in said compare bit register with corresponding bits of said identification code stored in said ID register and in response generating a second ANDed signal.

9. The self synchronizing automatic correlator of claim 8 wherein said comparing means further comprises a comparator having inputs that receive said first ANDed signal and said second ANDed signal and having a comparator output that provides said output signal for indicating valid detection of said input signal, said comparator comparing said first ANDed signal and said second ANDed signal, and in the event of a match therebetween, said comparator generates an active output signal to indicate valid detection of said input data signal.

10. The self synchronizing automatic correlator of claim 4 further comprising an error reporting circuit for receiving said corrected input data signal and in response generating an output control signal for indicating whether said input data signal contains no errors, whether said input data signal contains a correctable error, or whether said input data signal contains an uncorrectable error.

11. A self synchronizing automatic correlator that receives an input data signal from a source of said input data stream, said correlator comprising:

a) means for receiving said input data signal;

b) means for receiving a free running clock signal;

c) a clock recovery circuit for comparing said input data signal and said free running clock signal and generating a phase error signal responsive thereto, and for phase adjusting said clock signal by an amount equal to said phase error signal and in response generating a recovered clock signal synchronized to said input data signal;

d) a first shift register for receiving and storing said input data signal under control of said recovered clock signal;

e) first storage means for storing a user data signal;

f) comparing means connected to said shift register and said storage means for comparing said input data signal and said user data signal and in the event of a match therebetween generating an output signal for indicating valid detection of said input data signal a transmitter comprises;

g) means for receiving a data signal to be transmitted;

h) means for receiving a transmission clock signal;

i) a second storage means for storing said user data signal;

j) a second shift register for receiving and storing said data signal to be transmitted under control of said transmission clock signal; and k) a first logic circuit for receiving said user data signal from said second storage means and said data signal to be transmitted from said second shift register and in response generating a spreaded output data transmission signal.

12. The self synchronizing automatic correlator of claim 11 wherein said transmitter further comprises a second logic circuit for receiving said spreaded output data transmission signal and in response generating a plurality of syndrome bits for error correction.

13. The self synchronizing automatic correlator of claim 12 wherein said transmitter further comprises a third logic circuit for receiving and spreading said plurality of syndrome bits.

14. The self synchronizing automatic correlator of claim 13 wherein said transmitter further comprises an output circuit for receiving said spreaded output data transmission signal from said first logic circuit and the spreaded syndrome bits from said third logic circuit and in response shifting out said spreaded output data transmission signal and the spreaded syndrome bits in serial fashion.

* * * * *